(12) United States Patent
Watanabe et al.

(10) Patent No.: US 12,170,247 B2
(45) Date of Patent: Dec. 17, 2024

(54) SEMICONDUCTOR MEMORY DEVICE

(71) Applicant: Kioxia Corporation, Tokyo (JP)

(72) Inventors: Tadayoshi Watanabe, Yokkaichi Mie (JP); Kouji Matsuo, Ama Aichi (JP)

(73) Assignee: Kioxia Corporation, Tokyo (JP)

( * ) Notice: Subject to any disclaimer, the term of this patent is extended or adjusted under 35 U.S.C. 154(b) by 274 days.

(21) Appl. No.: 17/944,830

(22) Filed: Sep. 14, 2022

(65) Prior Publication Data
US 2023/0307359 A1    Sep. 28, 2023

(30) Foreign Application Priority Data

Mar. 23, 2022  (JP) ................. 2022-046554

(51) Int. Cl.
| | |
|---|---|
| *H01L 23/528* | (2006.01) |
| *G11C 16/04* | (2006.01) |
| *G11C 16/26* | (2006.01) |
| *H10B 41/27* | (2023.01) |
| *H10B 41/41* | (2023.01) |

(Continued)

(52) U.S. Cl.
CPC ........ *H01L 23/528* (2013.01); *G11C 16/0483* (2013.01); *G11C 16/26* (2013.01); *H10B 41/27* (2023.02); *H10B 41/41* (2023.02); *H10B 43/27* (2023.02); *H10B 43/40* (2023.02)

(58) Field of Classification Search
CPC ... H01L 23/528; G11C 16/0483; G11C 16/26; G11C 16/08; G11C 16/24; H10B 41/27; H10B 41/41; H10B 43/27; H10B 43/40; H10B 43/20; H10B 43/10; H10B 43/50
See application file for complete search history.

(56) References Cited

U.S. PATENT DOCUMENTS

| | | |
|---|---|---|
| 9,029,938 B2 | 5/2015 | Nakaki |
| 9,443,579 B2 | 9/2016 | Lee |

(Continued)

FOREIGN PATENT DOCUMENTS

| | | |
|---|---|---|
| JP | 2013-110193 A | 6/2013 |
| JP | 2015-056452 A | 3/2015 |
| JP | 6430657 B2 | 11/2018 |

OTHER PUBLICATIONS

U.S. Appl. No. 17/939,344, filed Sep. 7, 2022, Kioxia.

*Primary Examiner* — Allison Bernstein
(74) *Attorney, Agent, or Firm* — Foley & Lardner LLP

(57) ABSTRACT

A semiconductor memory device includes first memory layers and second memory layers arranged in alternation in a first direction. First memory layers and second memory layers include memory strings and first wirings connected to these memory strings in common. First memory layers and second memory layers include: signal amplifier circuits electrically connected to the first wirings; second wirings connected to the signal amplifier circuits; first switch transistors connected to the second wirings; third wirings electrically connected to the second wirings via the first switch transistors; and fourth wirings electrically connected to the second wirings without via the first switch transistors. The semiconductor memory device includes: first via-contact electrodes extending in the first direction and connected to the third wirings in first memory layers; and second via-contact electrodes extending in the first direction and connected to the fourth wirings in second memory layers.

20 Claims, 35 Drawing Sheets

(51) Int. Cl.
*H10B 43/27* (2023.01)
*H10B 43/40* (2023.01)

(56) References Cited

U.S. PATENT DOCUMENTS

| | | |
|---|---|---|
| 9,666,296 B1 | 5/2017 | Maejima |
| 10,607,995 B2 | 3/2020 | Roberts et al. |
| 10,629,265 B2 | 4/2020 | Futatsuyama et al. |
| 10,643,714 B2 | 5/2020 | Sakui |
| 11,328,776 B2 * | 5/2022 | Abiko .................... G11C 16/24 |
| 2020/0335513 A1 | 10/2020 | Morozumi et al. |
| 2022/0399349 A1 * | 12/2022 | Okada .................... G11C 16/08 |
| 2023/0352099 A1 * | 11/2023 | Kato ...................... G11C 16/32 |

* cited by examiner

SEMICONDUCTOR MEMORY DEVICE

CROSS-REFERENCE TO RELATED APPLICATIONS

This application is based upon and claims the benefit of Japanese Patent Application No. 2022-046554, filed on Mar. 23, 2022, the entire contents of which are incorporated herein by reference.

FIELD

Background

Embodiments described herein relate generally to a semiconductor memory device.

DESCRIPTION OF THE RELATED ART

There has been known a semiconductor memory device in which a plurality of memory cells are stacked in a direction intersecting with a surface of a substrate.

DETAILED DESCRIPTION

Figure 1:
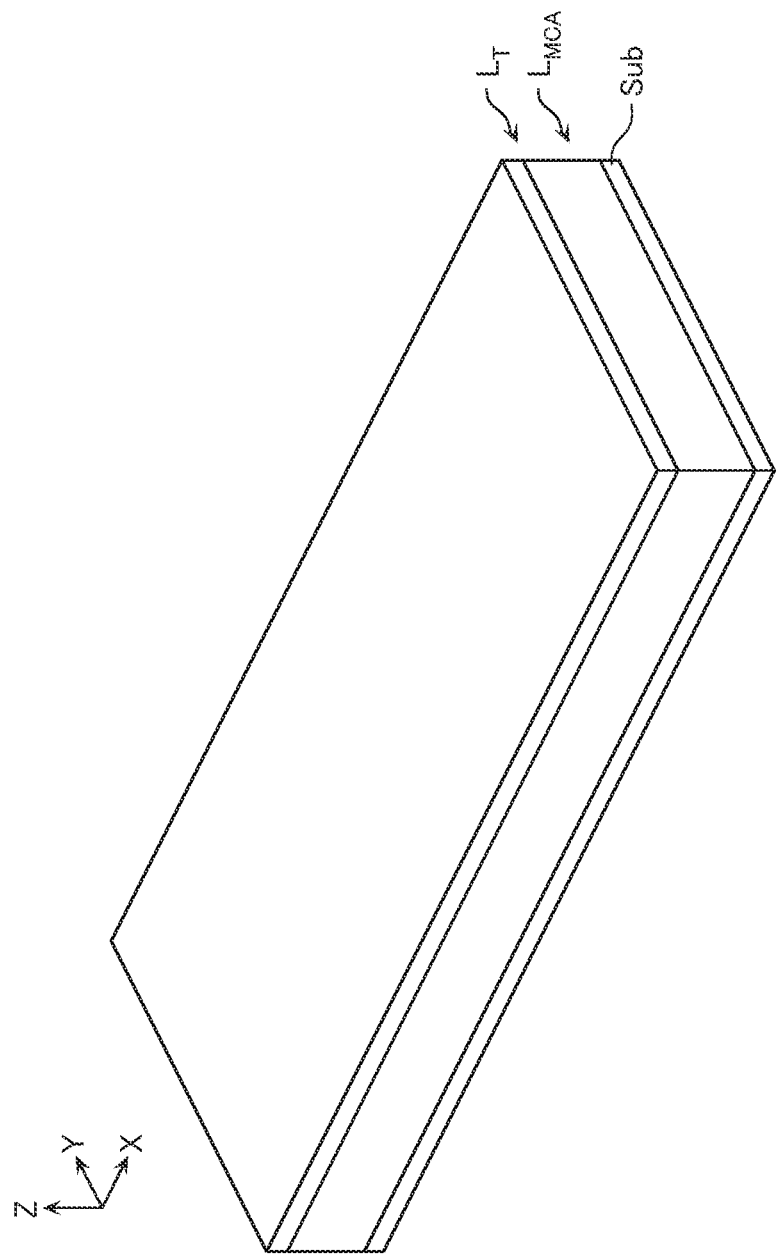
FIG. 1 is a schematic perspective view illustrating a configuration of a part of a semiconductor memory device according to a first embodiment.

A semiconductor memory device according to one embodiment comprises: a substrate; and a plurality of first memory layers and a plurality of second memory layers arranged in alternation in a first direction intersecting with a surface of the substrate. The substrate includes: a plurality of local block regions arranged in a second direction intersecting with the first direction; and a hook-up region aligned in the second direction with respect to the plurality of local block regions. In the plurality of local block regions, each of the plurality of first memory layers and the plurality of second memory layers includes: a plurality of memory strings extending in the second direction and arranged in a third direction intersecting with the first direction and the second direction; and a first wiring extending in the third direction and connected to the plurality of memory strings in common. In the hook-up region, each of the plurality of first memory layers and the plurality of second memory layers includes: a signal amplifier circuit electrically connected to the first wiring; a second wiring connected to the signal amplifier circuit; a first switch transistor connected to the second wiring; a third wiring electrically connected to the second wiring via the first switch transistor; and a fourth wiring electrically connected to the second wiring without via the first switch transistor. The hook-up region includes: a plurality of first via-contact electrodes extending in the first direction and connected to the third wirings in the plurality of first memory layers; and a plurality of second via-contact electrodes extending in the first direction and connected to the fourth wirings in the plurality of second memory layers.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

In this specification, when it is referred that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when it is referred that the first configuration "is connected between" the second configuration and a third configuration, it may mean that the first configuration, the second configuration, and the third configuration are connected in series and the second configuration is connected to the third configuration via the first configuration.

In this specification, when it is referred that a circuit or the like "electrically conducts" two wirings or the like, it may mean, for example, that this circuit or the like includes a transistor or the like, this transistor or the like is disposed in a current path between the two wirings, and this transistor or the like is turned ON.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as a side surface and the like.

First Embodiment

[Configuration]

FIG. 1 is a schematic perspective view illustrating a configuration of a part of a semiconductor memory device according to the first embodiment. The semiconductor memory device according to the embodiment includes a semiconductor substrate Sub, a memory cell array layer $L_{MCA}$ disposed above the semiconductor substrate Sub, and a transistor layer $L_T$ disposed above the memory cell array layer $L_{MCA}$.

The semiconductor substrate Sub is, for example, a semiconductor substrate, such as silicon (Si), containing P-type impurities, such as boron (B). On the upper surface of the semiconductor substrate Sub, a part of a peripheral circuit that controls a configuration in the memory cell array layer $L_{MCA}$ may be disposed.

The memory cell array layer $L_{MCA}$ includes memory cells MC described later. The transistor layer $L_T$ includes a control circuit that controls a configuration in the memory cell array layer $L_{MC}$.

[Configuration in Memory Cell Array Layer $L_{MCA}$]

Figure 2:
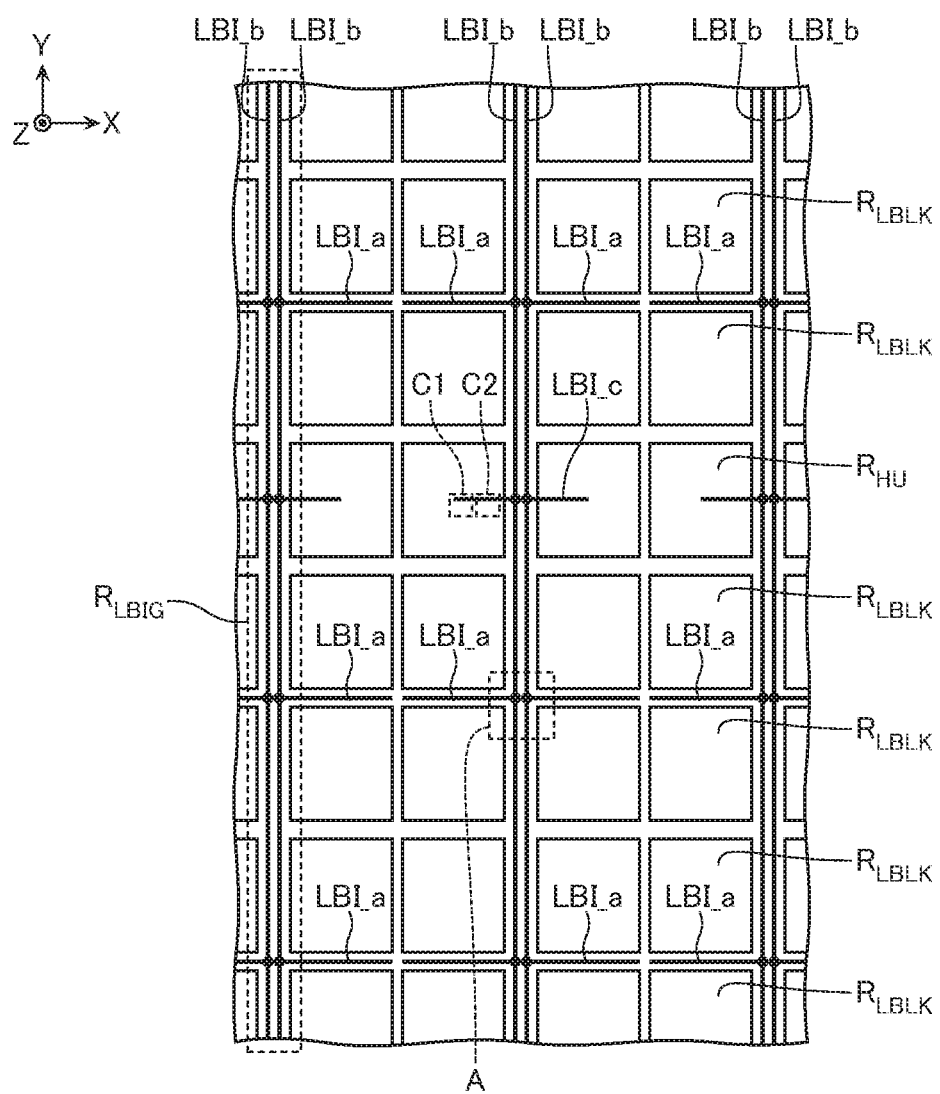
FIG. 2 is a schematic plan view illustrating a configuration of a part of the semiconductor memory device.

FIG. 2 is a schematic plan view illustrating a configuration of a part of the semiconductor memory device according to the embodiment. The semiconductor memory device according to the embodiment includes a plurality of local block regions $R_{LBLK}$, a plurality of hook-up regions $R_{HU}$, and a plurality of local block connection line regions $R_{LBIG}$. The local block regions $R_{LBLK}$ are arranged in a matrix in the X-direction and the Y-direction. Each of the hook-up regions $R_{HU}$ is disposed corresponding to the plurality of local block regions $R_{LBLK}$ arranged in the Y-direction. The hook-up regions $R_{HU}$ are arranged in the X-direction and adjacent to the local block region $R_{LBLK}$ in the Y-direction. Each of the local block connection line regions $R_{LBIG}$ is disposed corresponding to the plurality of local block regions $R_{LBLK}$ arranged in the Y-direction and the hook-up regions $R_{HU}$ corresponding to them. The local block connection line regions $R_{LBIG}$ are aligned with these plurality of local block regions $R_{LBLK}$ and the hook-up regions $R_{HU}$ in the X-direction.

In the example of FIG. 2, a local block connection line LBI_a extending in the X-direction is disposed between the two local block regions $R_{LBLK}$ arranged in the Y-direction. Each of the configurations in these two local block regions $R_{LBLK}$ is connected to the local block connection line LBI_a. The local block connection line region $R_{LBIG}$ includes a local block connection line LBI_b extending in the Y-direction. The plurality of local block connection lines LBI_a arranged in the Y-direction are connected to the local block connection line LBI_b in common. Additionally, the hook-up region $R_{HU}$ includes a local block connection line LBI_c extending in the X-direction. The local block connection line LBI_b is electrically connected to a configuration in the transistor layer $L_T$ via the configuration, such as the local block connection line LBI_c.

[Configuration in Local Block Region $R_{LBLK}$]

Figure 3:
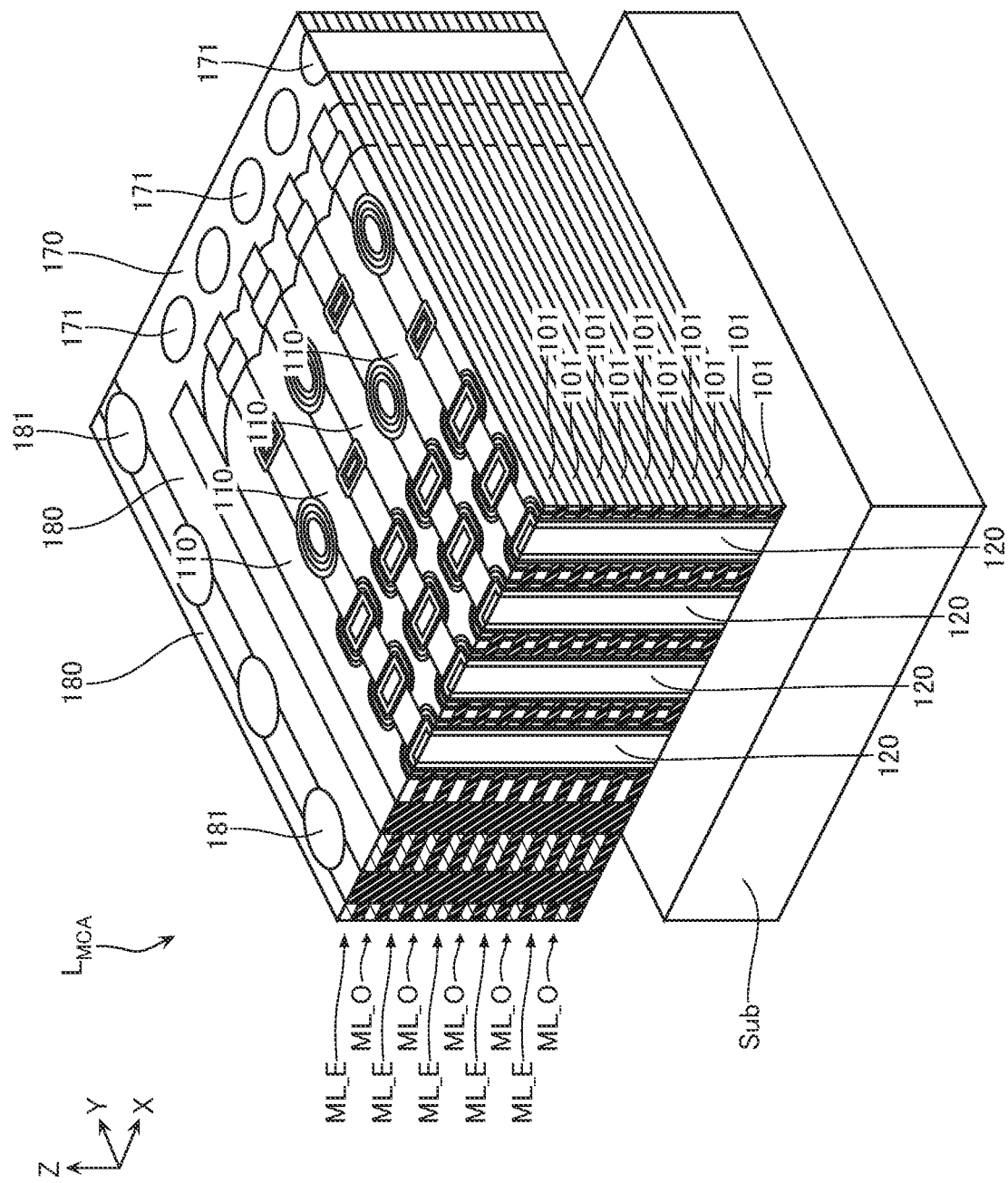
FIG. 3 is a schematic perspective view illustrating a configuration of a part of the semiconductor memory device.
Figure 4:
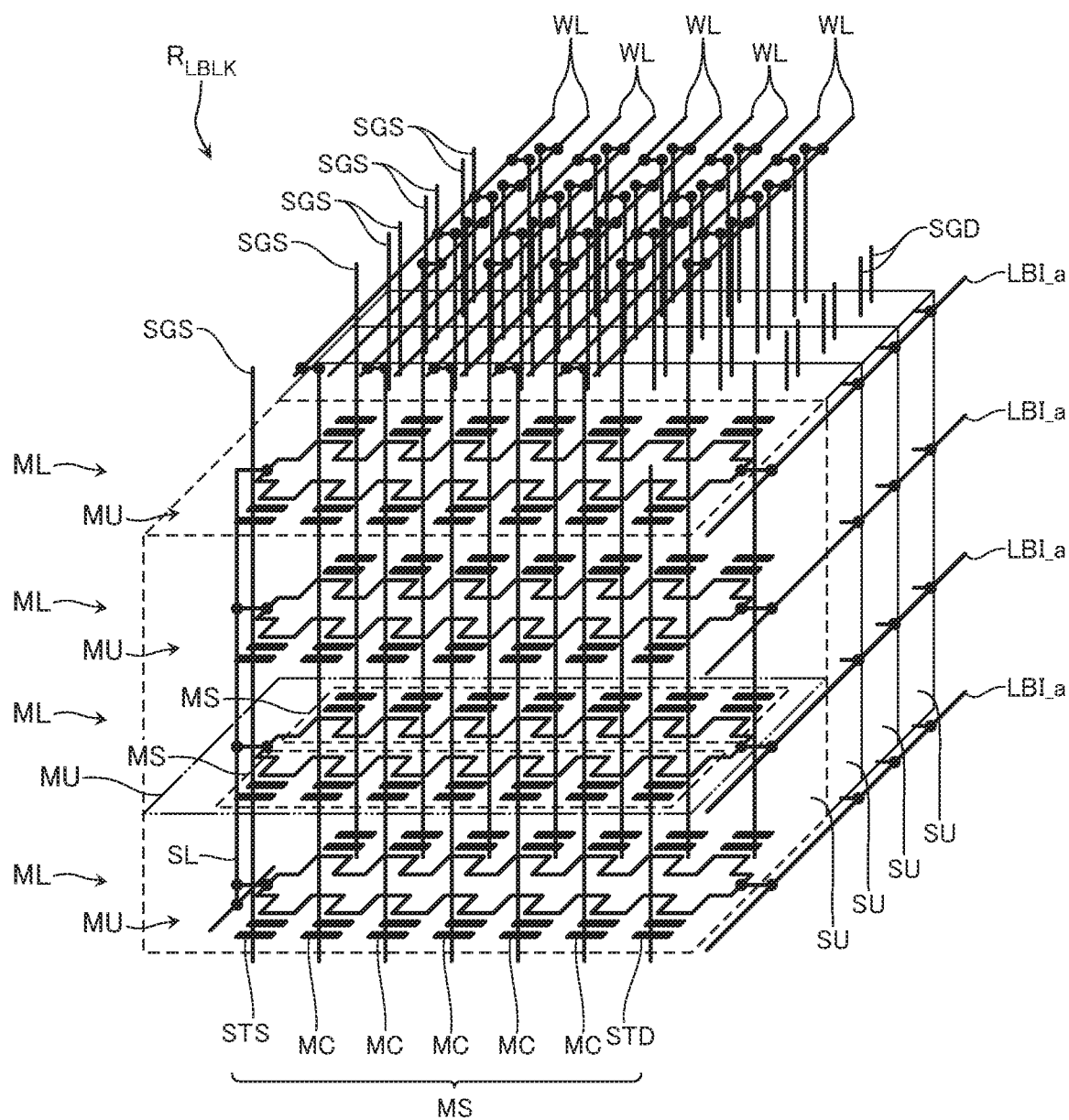
FIG. 4 is a schematic circuit diagram illustrating a configuration of a part of the semiconductor memory device.

FIG. 3 is a schematic perspective view illustrating a configuration of a part of the semiconductor memory device according to the embodiment. FIG. 4 is a schematic circuit diagram illustrating a configuration of a part of the semiconductor memory device according to the embodiment.

As illustrated in FIG. 3, the memory cell array layer $L_{MCA}$ includes a plurality of memory layers ML arranged in the Z-direction. FIG. 3 indicates the odd-numbered memory layer ML counted from the lower side as a memory layer ML_O and indicates the even-numbered memory layer ML counted from the lower side as a memory layer ML_E. Between two memory layers ML adjacent in the Z-direction, an insulating layer 101, such as silicon oxide ($SiO_2$), is disposed.

As illustrated in FIG. 4, each of the local block regions $R_{LBLK}$ includes a plurality of string units SU. Each of the string units SU includes a plurality of memory units MU disposed corresponding to the plurality of memory layers ML. Each of the plurality of memory units MU includes the two memory strings MS. Each of one ends of these two memory strings MS is connected to the local block connection line LBI_a. Each of the other ends of these two memory strings MS is connected to a common source line SL.

The memory string MS includes a drain-side select transistor STD, the plurality of memory cells MC (memory transistors), and a source-side select transistor STS. The drain-side select transistor STD, the plurality of memory cells MC, and the source-side select transistor STS are connected in series between the local block connection lines LBI_a and the source line SL. Hereinafter, the drain-side select transistor STD and the source-side select transistor STS are simply referred to as select transistors (STD, STS) in some cases.

The memory cell MC is a field-effect type transistor. The memory cell MC includes a semiconductor layer, a gate insulating film, and a gate electrode. The semiconductor layer functions as a channel region. The gate insulating film includes an electric charge accumulating layer. A threshold voltage of the memory cell MC changes according to an electric charge amount in the electric charge accumulating layer. The memory cell MC stores one bit or a plurality of bits of data. Note that a word line WL is connected to each of gate electrodes of the plurality of memory cells MC included in one memory unit MU. Each of these word lines WL is connected to all of the memory units MU in one local block region $R_{LBLK}$ in common.

The select transistors (STD, STS) are field-effect type transistors. The select transistor (STD, STS) includes a semiconductor layer, a gate insulating film, and a gate electrode. The semiconductor layer functions as a channel region. Select gate lines (SGD, SGS) are connected to gate electrodes of the select transistors (STD, STS), respectively. Each of two drain-side select gate lines corresponding to the two memory strings MS is connected to all of the memory units MU in one string unit SU in common. Each of two source-side select gate lines SGS corresponding to the two memory strings MS is connected to all of the memory units MU in one string unit SU in common.

Figure 5:
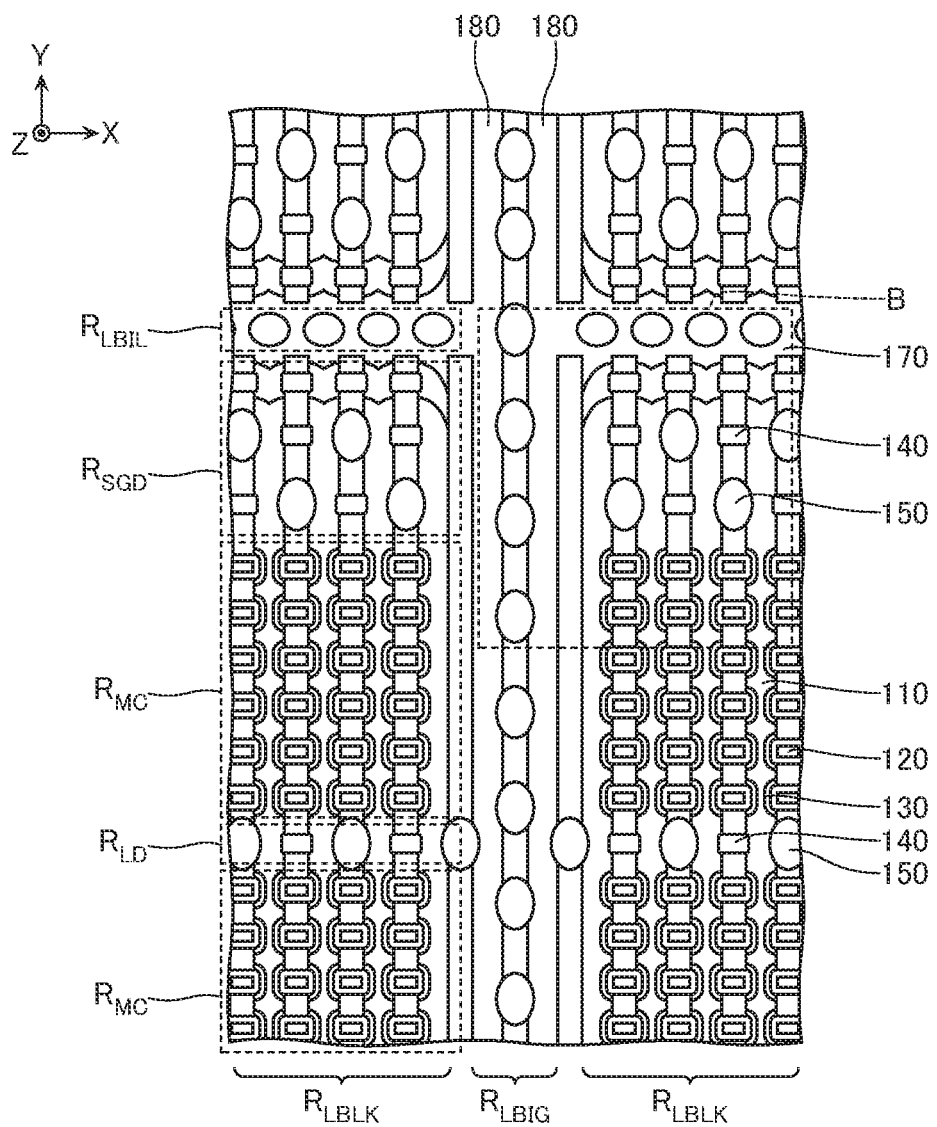
FIG. 5 is a schematic plan view illustrating an enlarged part indicated by A in FIG. 2.
Figure 6:
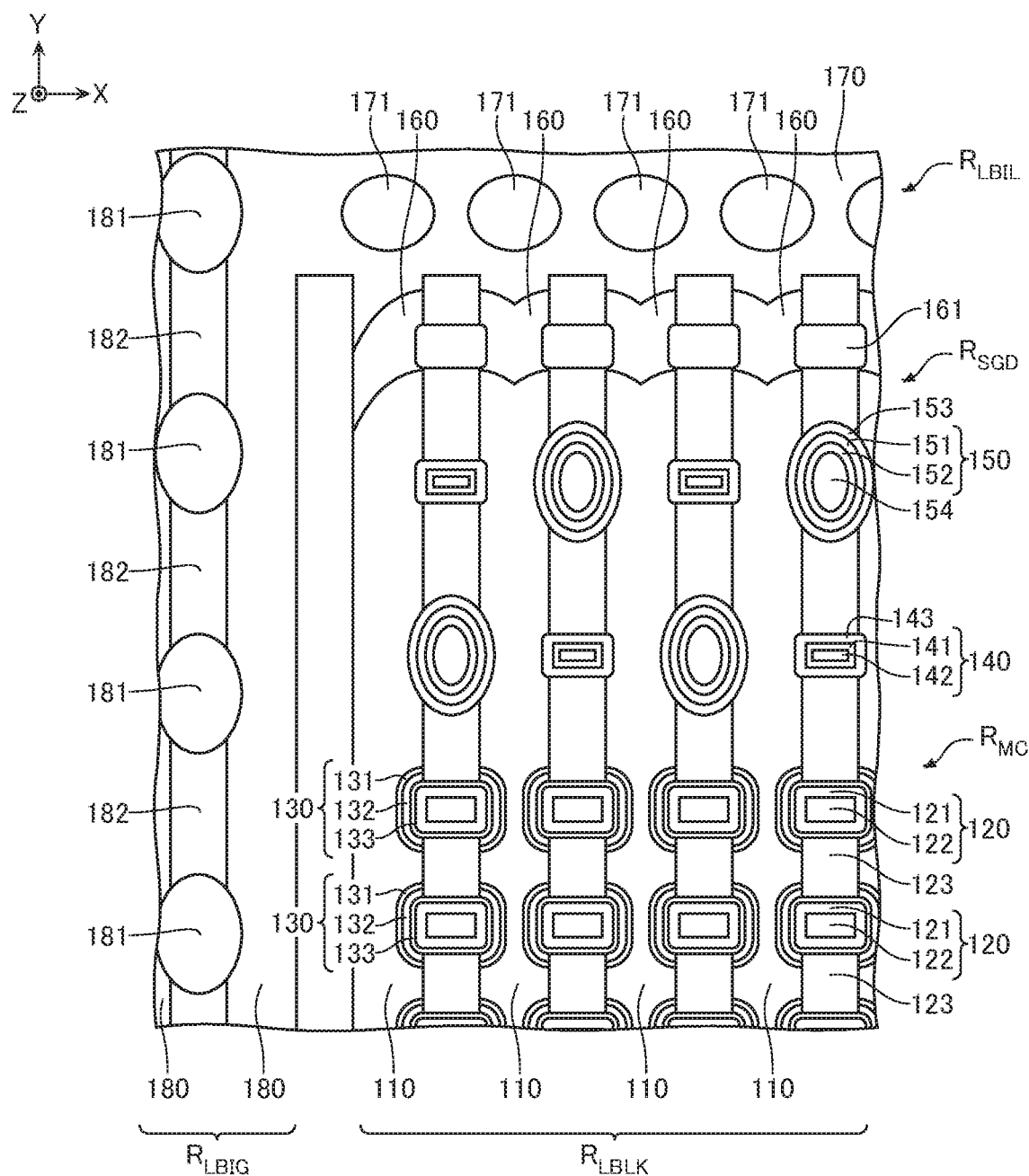
FIG. 6 is a schematic plan view illustrating an enlarged part indicated by B in FIG. 5.

FIG. 5 is a schematic plan view illustrating an enlarged part indicated by A in FIG. 2. FIG. 6 is a schematic plan view illustrating an enlarged part indicated by B in FIG. 5.

As illustrated in FIG. 5, the local block region $R_{LBLK}$ includes a plurality of memory cell regions $R_{MC}$ arranged in the Y-direction and a ladder region $R_{LD}$ disposed between two memory cell regions $R_{MC}$ adjacent in the Y-direction. Additionally, a select transistor region $R_{SGD}$ is disposed at an end portion of the local block region $R_{LBLK}$ in the Y-direction. Note that a local block connection line region $R_{LBIL}$ is disposed between the two local block regions $R_{LBLK}$ arranged in the Y-direction.

As illustrated in FIG. 6, the memory layer ML includes a plurality of semiconductor layers 110 arranged in the X-direction. Each of these plurality of semiconductor layers 110 extends in the Y-direction across the plurality of memory cell regions $R_{MC}$, the plurality of ladder regions $R_{LD}$, and the select transistor region $R_{SGD}$ described with reference to FIG. 5. The semiconductor layers 110, for example, function as the plurality of memory cells MC (FIG. 4) connected in series and channel regions of the select transistors (STD, STS) connected to them. The semiconductor layer 110, for example, may contain non-doped polycrystalline silicon (Si).

For example, as illustrated in FIG. 6, the memory cell region $R_{MC}$ includes a plurality of via-electrodes 120 positioned between two semiconductor layers 110 adjacent in the X-direction and arranged in the Y-direction. In the memory cell region $R_{MC}$, the memory layer ML includes a plurality of gate insulating layers 130 disposed between side surfaces in the X-direction of the plurality of via-electrodes 120 and the semiconductor layer 110.

The via-electrodes 120, for example, function as gate electrodes of the plurality of memory cells MC, the word lines WL connected to them, and the like. For example, as illustrated in FIG. 6, the via-electrode 120 may include a barrier conductive layer 121, such as titanium nitride (TiN), and a conductive layer 122, such as tungsten (W). For example, as illustrated in FIG. 3, the via-electrode 120 passes through the plurality of memory layers ML and extends in the Z-direction. Note that, between two via-electrodes 120 adjacent in the Y-direction, an insulating layer 123 (FIG. 6), such as silicon oxide ($SiO_2$), is disposed.

The gate insulating layer 130 includes, for example, a tunnel insulating layer 131 disposed on a side surface in the X-direction of the semiconductor layer 110, an electric charge accumulating layer 132 disposed on the side surface in the X-direction of the tunnel insulating layer 131, and a block insulating layer 133 disposed on the side surface in the X-direction of the electric charge accumulating layer 132.

The tunnel insulating layer 131 may, for example, contain silicon oxide ($SiO_2$).

The electric charge accumulating layer 132 may contain, for example, polycrystalline silicon (Si). The polycrystalline silicon (Si) may contain N-type impurities, such as phosphorus (P), or P-type impurities, such as boron (B), or need not contain these impurities.

The block insulating layer 133 may contain, for example, silicon oxide ($SiO_2$). The block insulating layer 133 may include any insulating metal oxide film including aluminum oxide (AlO) and hafnium oxide (HfO).

In the select transistor region $R_{SGD}$ (FIG. 6), a conductive layer 140 and a via-electrode 150 positioned between two semiconductor layers 110 adjacent in the X-direction and arranged in the Y-direction are disposed. In the select transistor region $R_{SGD}$, the memory layer ML includes a plurality of semiconductor layers 160 connected to one ends in the Y-direction of the plurality of semiconductor layers 110.

The conductive layer 140 functions as, for example, a contact electrode to form the hole channels in the semiconductor layer 110 and apply a voltage to the hole channels formed in the semiconductor layer 110. For example, as illustrated in FIG. 6, the conductive layer 140 may include a semiconductor layer 141 of, for example, polycrystalline silicon (Si) containing P-type impurities, such as boron (B), and a conductive layer 142 of, for example, titanium nitride (TiN). The conductive layer 140 passes through the plurality of memory layers ML and extends in the Z-direction. A semiconductor layer 143 containing, for example, non-doped polycrystalline silicon (Si) may be disposed on an outer peripheral surface of the conductive layer 140. The semiconductor layer 143 may be omitted.

The via-electrodes 150, for example, function as gate electrodes of the plurality of drain-side select transistors STD, the drain-side select gate lines SGD connected to them, and the like. For example, as illustrated in FIG. 6, the via-electrode 150 may include a semiconductor layer 151 of, for example, polycrystalline silicon (Si), containing N-type impurities, such as phosphorus (P), and a conductive layer 152 of, for example, titanium nitride (TiN). The via-electrode 150 passes through the plurality of memory layers ML and extends in the Z-direction. An insulating layer 153 of, for example, silicon oxide ($SiO_2$) is disposed on an outer peripheral surface of the via-electrode 150. An insulating layer 154 of, for example, silicon oxide ($SiO_2$) may be disposed at the center part of the via-electrode 150. A width in the Y-direction of the via-electrode 150 may be larger than a width in the Y-direction of the conductive layer 140.

The semiconductor layer 160 may include a semiconductor layer of, for example, polycrystalline silicon (Si) containing N-type impurities, such as phosphorus (P). Between two semiconductor layers 160 adjacent in the X-direction, an insulating layer 161 is disposed. The insulating layer 161 may contain, for example, silicon oxide ($SiO_2$). The insulating layer 161 passes through the plurality of memory layers ML and extends in the Z-direction.

In the ladder region $R_{LD}$ (FIG. 5), the conductive layer 140 or the via-electrode 150 is disposed between two semiconductor layers 110 adjacent in the X-direction. Although the illustration is omitted, the semiconductor layer 143 (FIG. 6) and the insulating layer 153 (FIG. 6) are disposed on outer peripheral surfaces of the conductive layer 140 and the via-electrode 150, respectively.

In the local block connection line region $R_{LBIL}$ (FIG. 6), the memory layer ML includes a conductive layer 170. In the local block connection line region $R_{LBIL}$, a plurality of insulating layers 171 (FIG. 6) arranged in the X-direction along the conductive layer 170 are disposed.

The conductive layer 170 functions as, for example, the local block connection line LBI_a (FIG. 2). The conductive layer 170 may contain, for example, titanium nitride (TiN). The conductive layer 170 extends in the X-direction and is connected to the plurality of semiconductor layers 110 via the plurality of semiconductor layers 160. The conductive layer 170 is electrically connected to the semiconductor layers 110 in the two local block regions $R_{LBLK}$ arranged in the Y-direction.

The insulating layer 171 may contain, for example, silicon oxide ($SiO_2$). For example, as illustrated in FIG. 3, the insulating layer 171 passes through the plurality of memory layers ML and extends in the Z-direction.

[Configuration in Local Block Connection Line Region $R_{LBIG}$]

In the local block connection line region $R_{LBIG}$, the memory layer ML includes a pair of conductive layers 180 extending in the Y-direction. In the local block connection line region $R_{LBIG}$, a plurality of insulating layers 181 positioned between two conductive layers 180 adjacent in the X-direction and arranged in the Y-direction are disposed.

The conductive layer 180 functions as, for example, the local block connection line LBI_b (FIG. 2). The conductive layer 180 may contain, for example, titanium nitride (TiN). The conductive layers 180 extend in the Y-direction and are connected to one end portions in the X-direction of the plurality of conductive layers 170.

The insulating layer 181 may contain, for example, silicon oxide ($SiO_2$). The insulating layer 181 passes through the plurality of memory layers ML and extends in the Z-direction. Between two insulating layers 181 adjacent in the Y-direction, an insulating layer 182 of, for example, silicon oxide ($SiO_2$) is disposed. A width in the X-direction of the insulating layer 181 may be larger than a width in the X-direction of the insulating layer 182.

[Configuration in Hook-Up Region $R_{HU}$]
[Configuration of Hook-Up]

Figure 7:
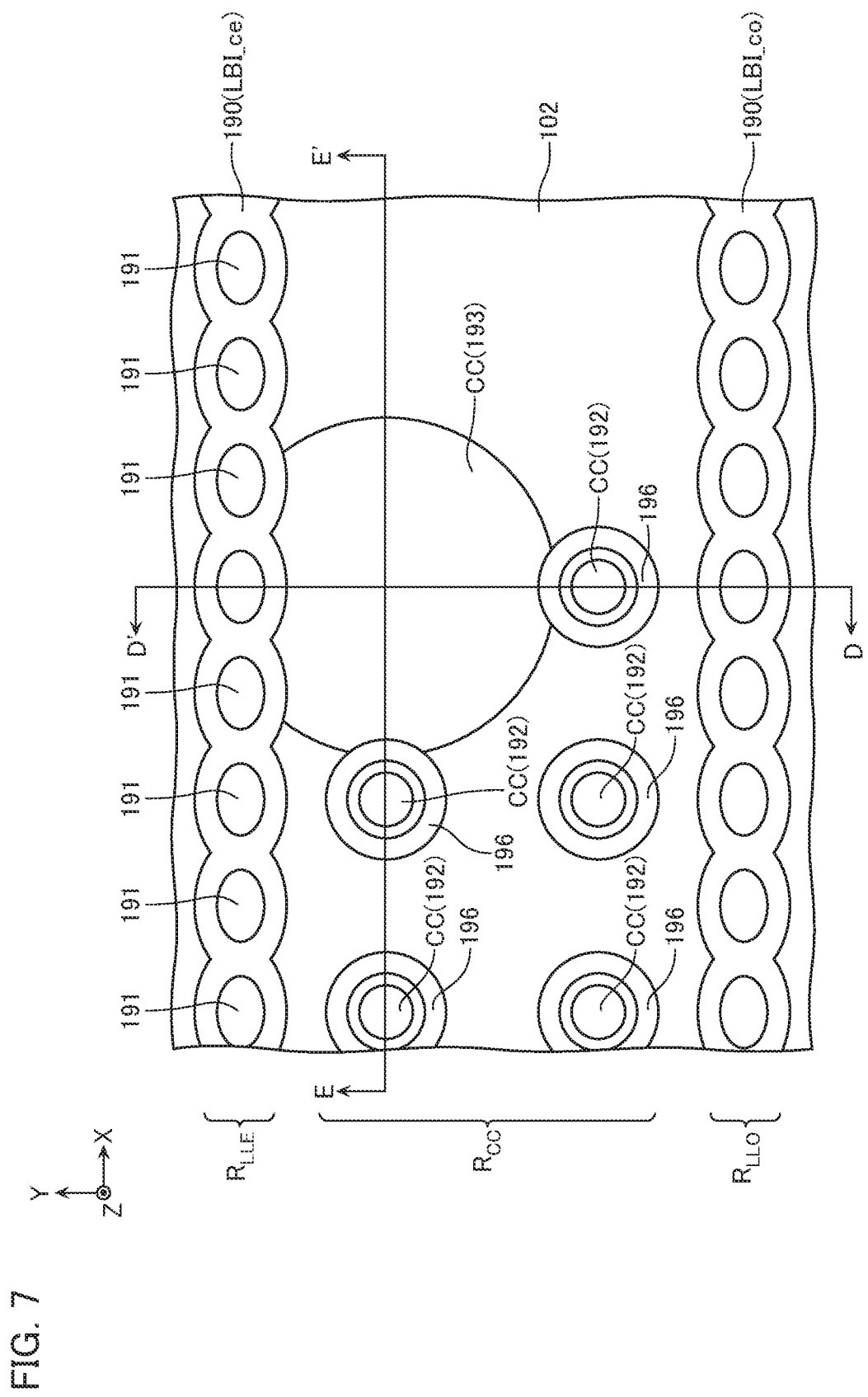
FIG. 7 is a schematic plan view illustrating an enlarged part indicated by C1 in FIG. 2.
Figure 8:
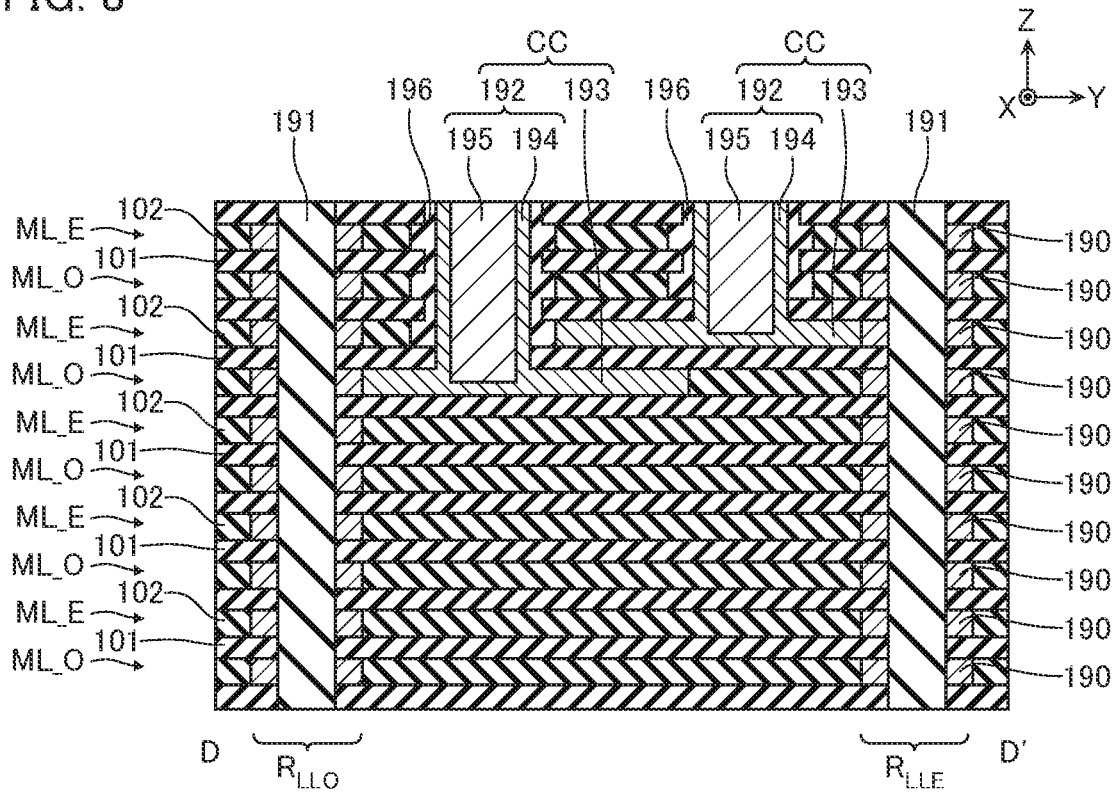
FIG. 8 is a schematic cross-sectional view of a structure illustrated in FIG. 7 is taken along line D-D' and viewed in an arrow direction.
Figure 9:
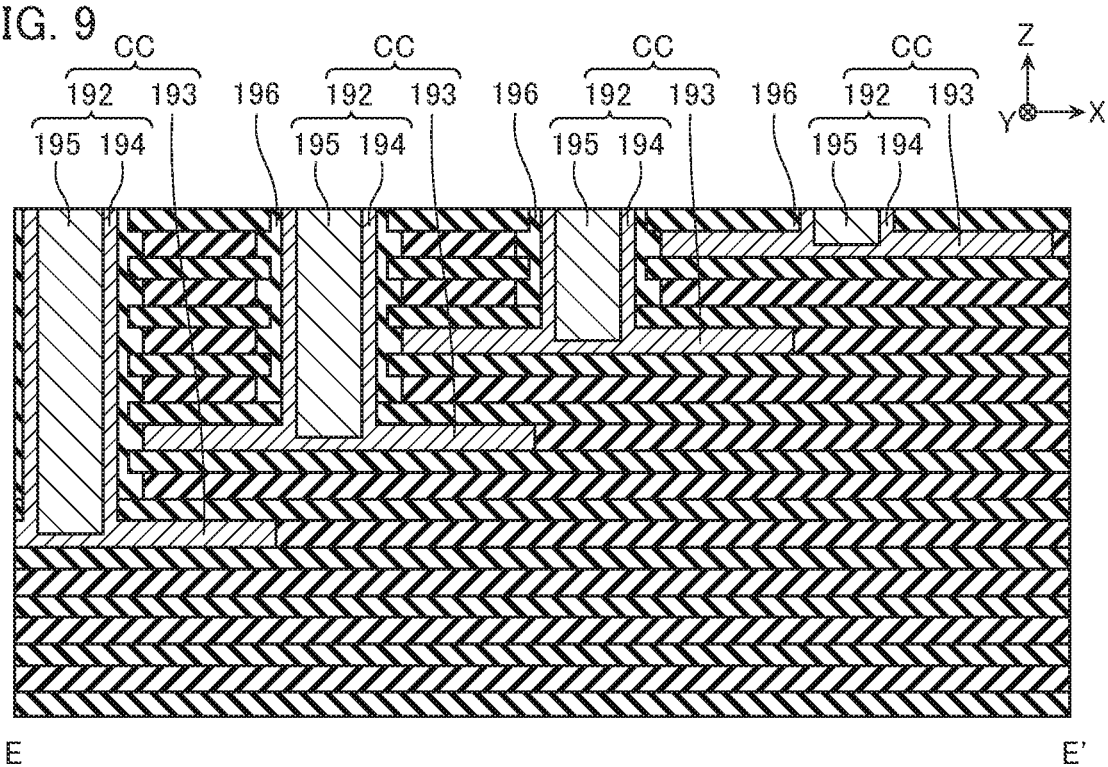
FIG. 9 is a schematic cross-sectional view of the structure illustrated in FIG. 7 is taken along line E-E' and viewed in an arrow direction.

FIG. 7 is a schematic plan view illustrating an enlarged part indicated by C1 in FIG. 2. FIG. 8 is a schematic cross-sectional view of a structure illustrated in FIG. 7 taken along the line D-D' and viewed along the arrow direction. FIG. 9 is a schematic cross-sectional view of the structure illustrated in FIG. 7 taken along the line E-E' and viewed along the arrow direction.

As illustrated in FIG. 7, the hook-up region $R_{HU}$ includes a plurality of lead line regions $R_{LLE}$, $R_{LLO}$ arranged in the X-direction and a via-contact electrode region $R_{CC}$ disposed between two lead line regions $R_{LLE}$, $R_{LLO}$ adjacent in the X-direction.

In the lead line regions $R_{LLE}$, $R_{LLO}$, the memory layer ML includes a conductive layer 190 extending in the X-direction. The lead line regions $R_{LLE}$, $R_{LLO}$ include a plurality of insulating layers 191 arranged in the X-direction along the conductive layer 190.

The conductive layer 190 functions as the local block connection line LBI_c (FIG. 2). Hereinafter, the local block connection line LBI_c corresponding to the conductive layer 190 in the lead line region $R_{LLE}$ is referred to as a local block connection line LBI_ce in some cases. Additionally, the local block connection line LBI_c corresponding to the conductive layer 190 in the lead line region $R_{LLO}$ is referred to as a local block connection line LBI_co in some cases. The conductive layer 190 may contain, for example, titanium nitride (TiN). The conductive layer 190 is electrically connected to the conductive layer 180, which has been described with reference to FIG. 2 to FIG. 6. In the example of FIG. 7, a plurality of convex curved surfaces corresponding to the plurality of insulating layers 191 are disposed on side surfaces in the Y-direction of the conductive layer 190.

The insulating layer 191 may include an insulating layer of, for example, silicon oxide ($SiO_2$). For example, as illustrated in FIG. 8, the insulating layer 191 passes through the plurality of memory layers ML and extends in the Z-direction.

For example, as illustrated in FIG. 7, the via-contact electrode region $R_{cc}$ includes a plurality of via-contact electrodes CC arranged in the X-direction along the conductive layer 190. In the via-contact electrode region $R_{cc}$, the memory layer ML includes an insulating layer 102 of, for example, silicon nitride ($Si_3N_4$).

For example, as illustrated in FIG. 8, the via-contact electrode CC includes a part 192 having an approximately columnar shape and a part 193 having an approximately disk shape disposed on a lower end portion of the part 192.

The part 192 may include a barrier conductive layer 194 of, for example, titanium nitride (TiN) and a conductive layer 195 of, for example, tungsten (W). The part 192 passes through the plurality of memory layers ML and extends in the Z-direction. An insulating layer 196 of, for example, silicon oxide ($SiO_2$) may be disposed on an outer peripheral surface of the part 192. A part of the outer peripheral surface of the insulating layer 196 is in contact with the insulating layers 101. A part of an outer peripheral surface of the insulating layer 196 is in contact with the insulating layers 102. A thickness in a radial direction of the part in contact with the insulating layer 102 of the insulating layer 196 may be larger than a thickness in a radial direction of the part in contact with the insulating layer 101 of the insulating layer 196.

The part 193 may include the barrier conductive layer 194 of, for example, titanium nitride (TiN). The part 193 is included in any of the memory layers ML and connected to a side surface in the X-direction of the conductive layer 190 included in any of the memory layers ML. In the hook-up region $R_{HU}$, the via-contact electrodes CC corresponding to all of the memory layers ML may be disposed. In this case, the number of via-contact electrodes CC may match the number of memory layers ML, or may be larger than the number of memory layers ML.

For example, as illustrated in FIG. 7 as an example, outlines of the parts 192 may be disposed along circumferences of circles having predetermined radii. A part of an outline of the part 193 may be disposed along a circumference of a circle having a radius larger than this. Another part of the outline of the part 193 may be disposed inside this circle. For example, in the example of FIG. 7, a connection part with the conductive layer 190 of the part 193 includes a plurality of recessed curved surfaces. The parts are disposed inside the circle. In the example of FIG. 7, a connection part with the insulating layer 196 of the part 193 includes a recessed curved surface disposed along an outer peripheral surface of a circle having the center point of the via-contact electrode CC corresponding to the insulating layer 196 as its center. The part is disposed inside the circle. An area in the X-Y cross-sectional surface of the part 193 may be larger than an area in the X-Y cross-sectional surface of the part 192.

As illustrated in FIG. 8 as an example, in the memory layer ML_O, the conductive layer 190 disposed in the lead line region $R_{LLO}$ is connected to the via-contact electrode CC. Additionally, in the memory layer ML_O, the conductive layer 190 disposed in the lead line region $R_{LLE}$ is not connected to the via-contact electrode CC.

In the memory layer ML_E, the conductive layer 190 disposed in the lead line region $R_{LLO}$ is not connected to the via-contact electrode CC. Additionally, in the memory layer ML_E, the conductive layer 190 disposed in the lead line region $R_{LLE}$ is connected to the via-contact electrode CC.

[Configurations of Pre-Amplifier Circuit PA and Switch Circuit ES_SW]

Figure 10:
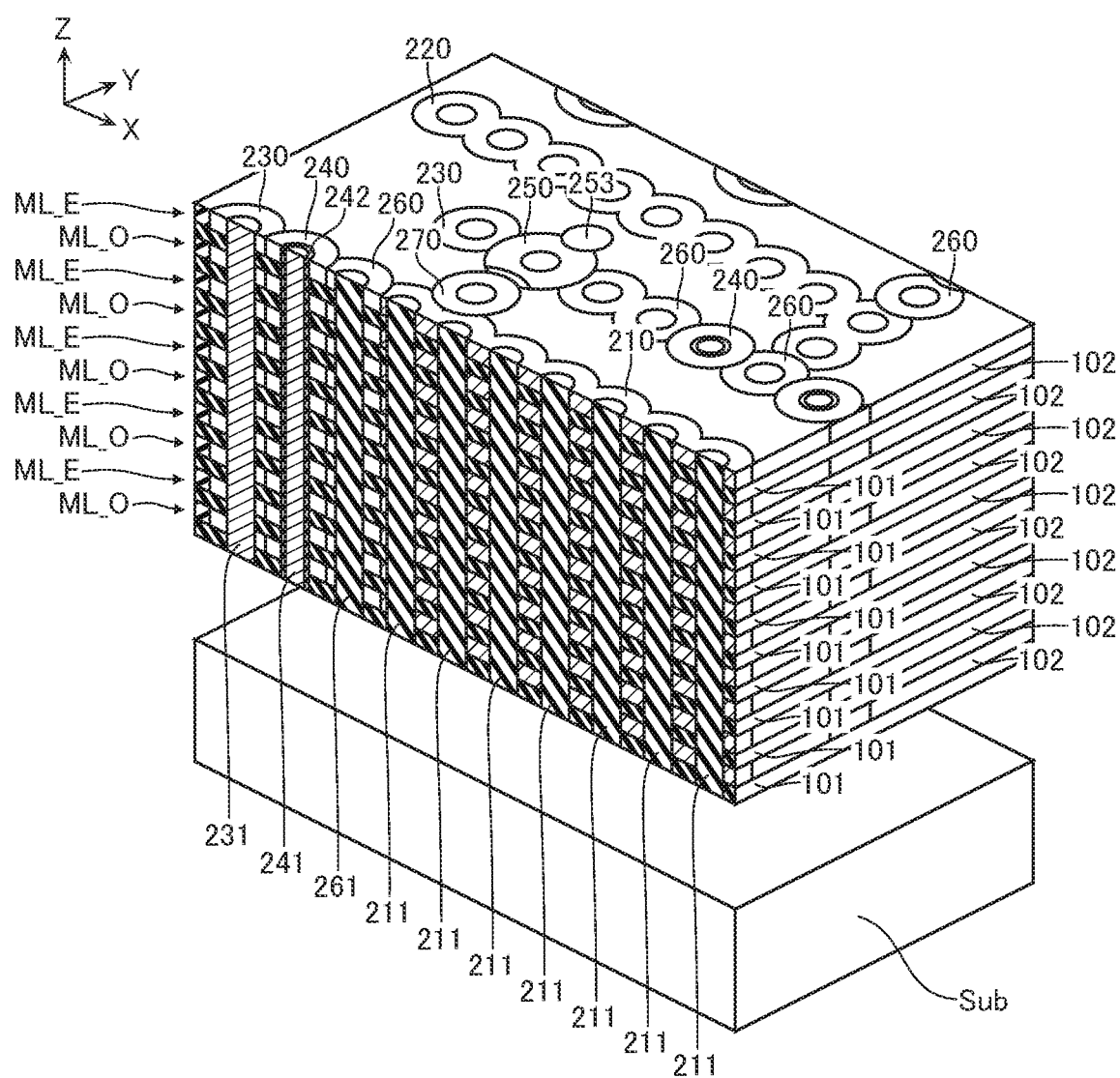
FIG. 10 is a schematic plan view illustrating an enlarged part indicated by C2 in FIG. 2.
Figure 11:
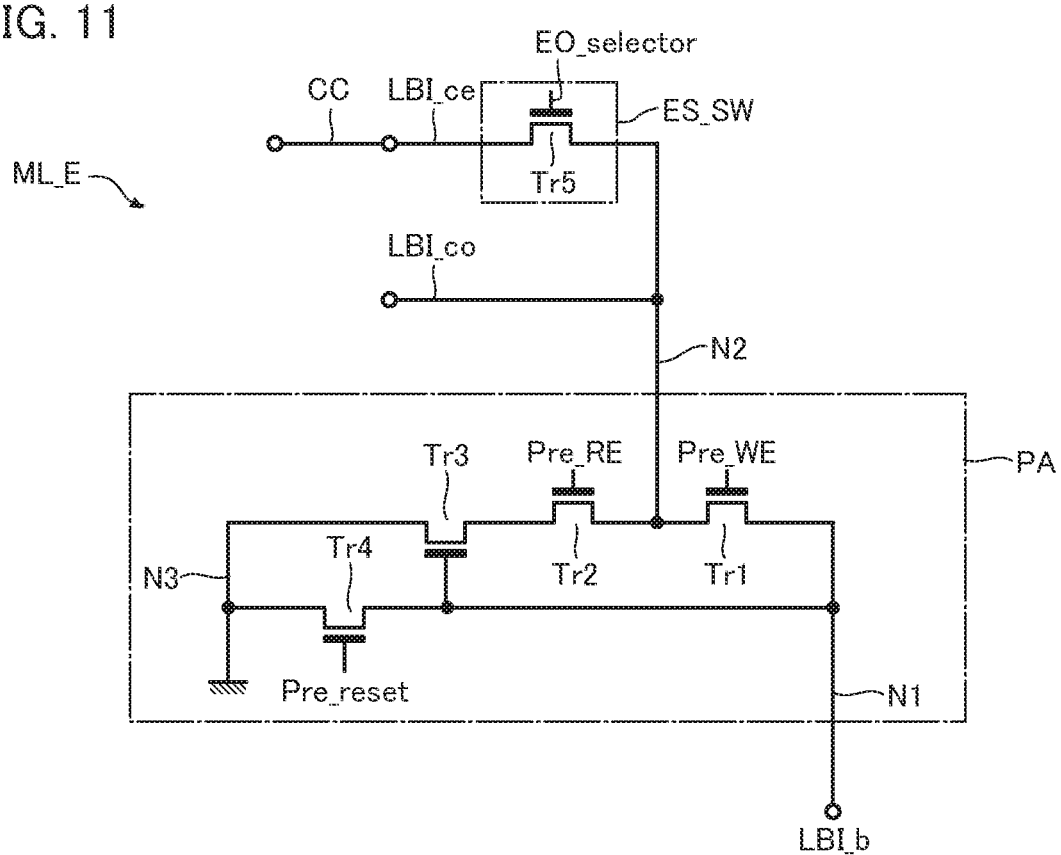
FIG. 11 is a schematic circuit diagram for describing a configuration of a part of the semiconductor memory device according to the embodiment.
Figure 12:
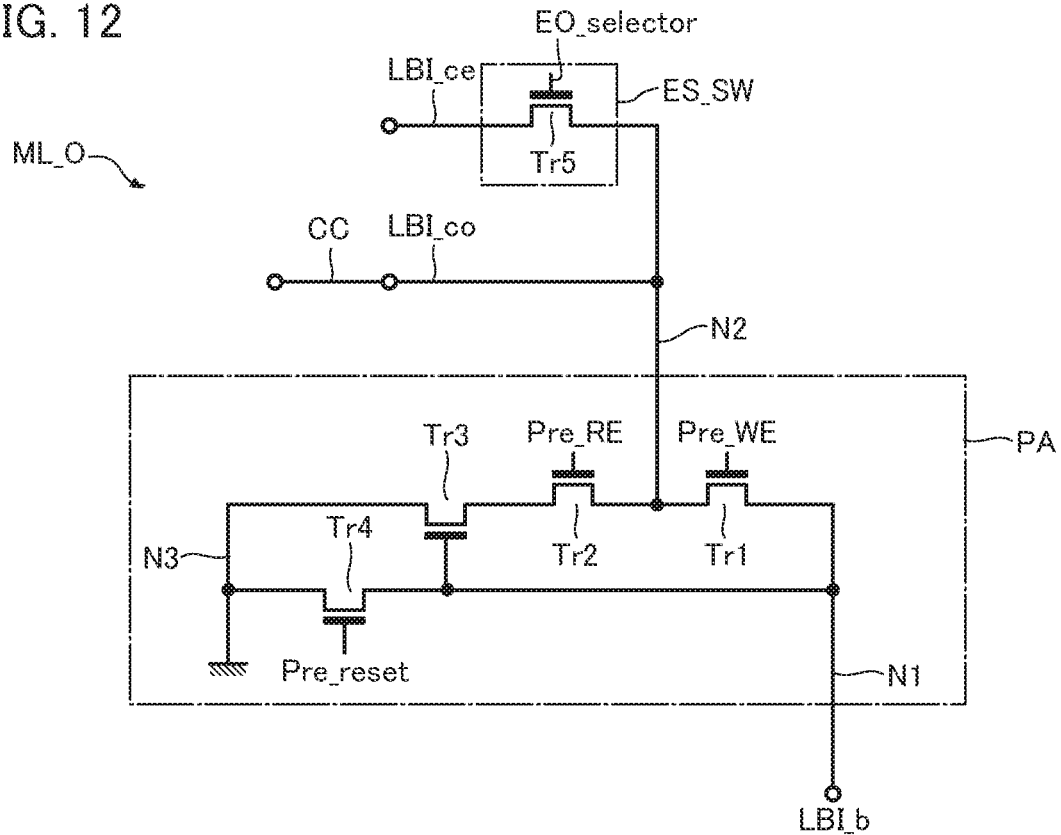
FIG. 12 is a schematic circuit diagram for describing a configuration of a part of the semiconductor memory device.
Figure 13:
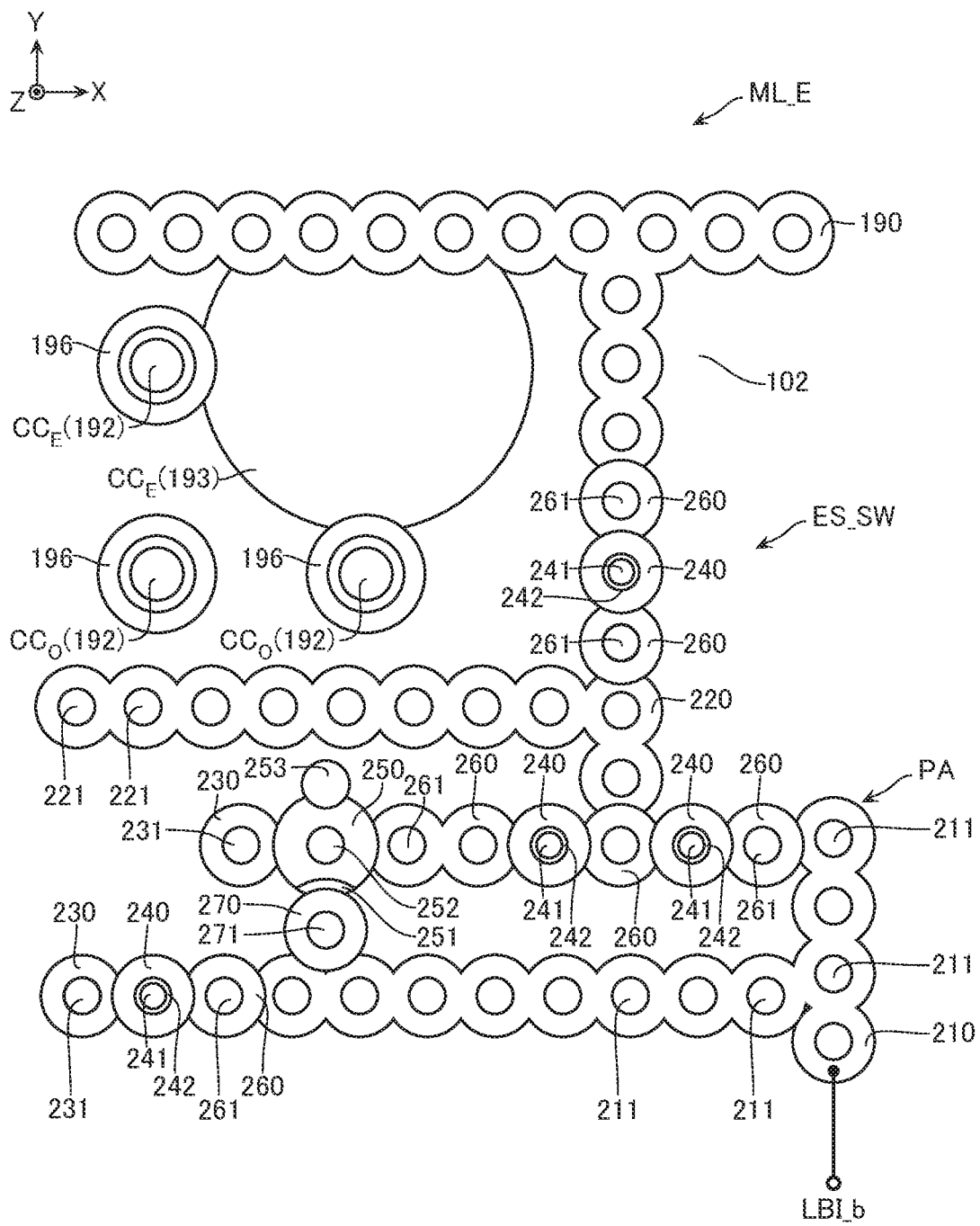
FIG. 13 is a schematic plan view for describing a configuration of a part of the semiconductor memory device.
Figure 14:
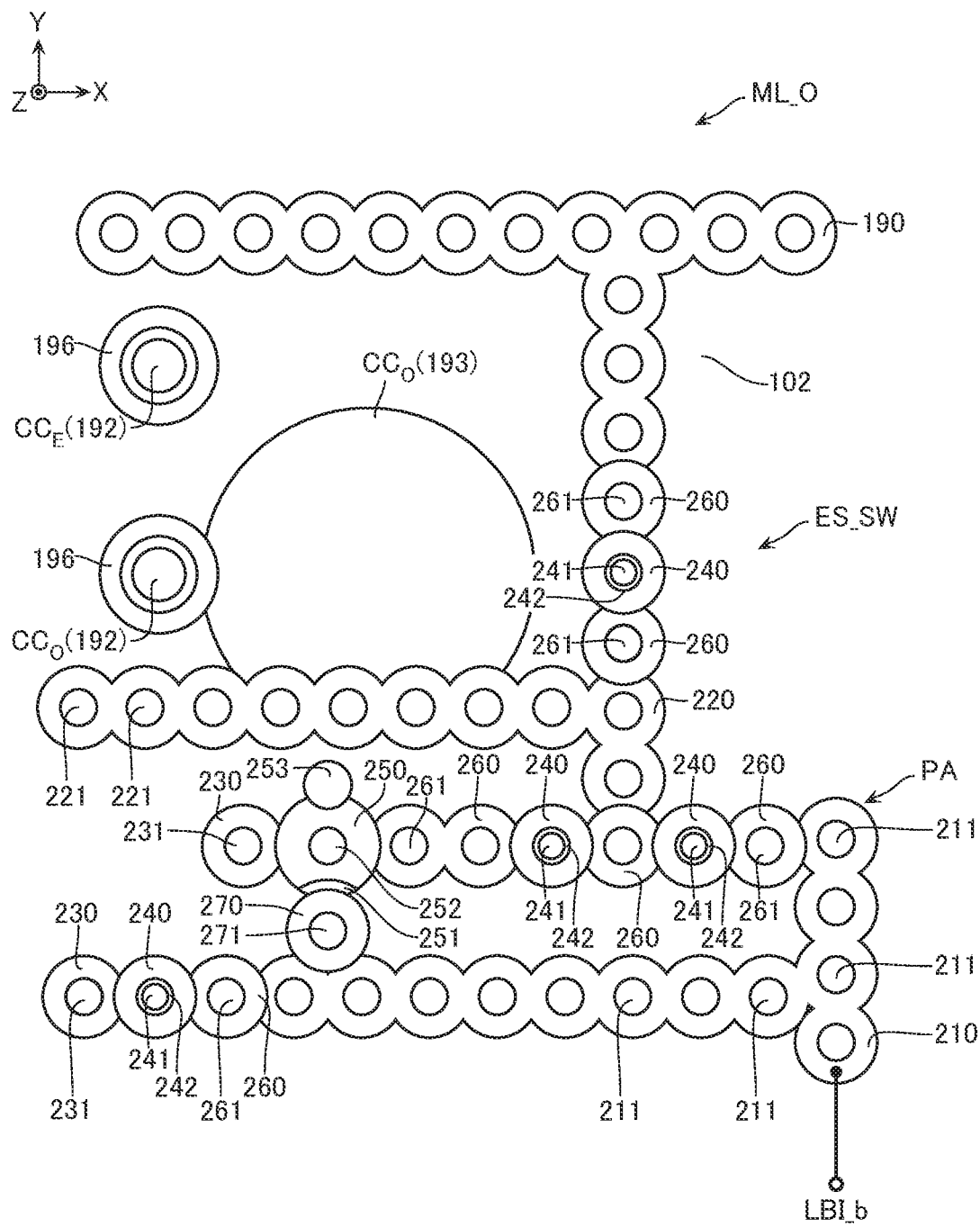
FIG. 14 is a schematic plan view for describing a configuration of a part of the semiconductor memory device.

FIG. 10 is a schematic plan view illustrating an enlarged part indicated by C2 in FIG. 2. FIG. 11 and FIG. 12 are schematic circuit diagrams for describing the configuration of a part of the semiconductor memory device according to the embodiment. FIG. 13 and FIG. 14 are schematic plan views for describing the configuration of a part of the semiconductor memory device according to the embodiment.

Note that FIG. 13 and FIG. 14 indicate the via-contact electrode CC connected to the conductive layer 190 in the memory layer ML_E as a via-contact electrode $CC_E$, and indicate the via-contact electrode CC connected to the conductive layer 190 in the memory layer ML_O as a via-contact electrode $CC_O$.

As illustrated in FIG. 11 and FIG. 12, each of the memory layers ML_O, ML_E includes the pre-amplifier circuit PA and the switch circuit ES_SW.

As illustrated in FIG. 11 and FIG. 12, the pre-amplifier circuit PA includes nodes N1 to N3. The node N1 electrically conducts with the conductive layer 180 (the local block connection line LBI_b) described with reference to, for example, FIG. 5 and FIG. 6. The node N2 electrically conducts with the local block connection line LBI_co. The node N2 is electrically connected to the local block connection line LBI_ce via the switch circuit ES_SW. The node N3 electrically conducts with a voltage supply line to which a ground voltage is applied.

The pre-amplifier circuit PA includes a transistor Tr1, which is connected between the nodes N1 and N2, transistors Tr2 and Tr3, which are connected in series between the nodes N2 and N3, and a transistor Tr4, which is connected between the nodes N1, N3. The transistors Tr1 to Tr4 are, for example, N-channel type field effect transistors.

A source electrode of the transistor Tr1 is connected to the node N2. A drain electrode of the transistor Tr1 is connected to the node N1. A gate electrode of the transistor Tr1 is connected to a signal line Pre_WE.

A source electrode of the transistor Tr2 is connected to a drain electrode of the transistor Tr3. A drain electrode of the transistor Tr2 is connected to the node N2. A gate electrode of the transistor Tr2 is connected to a signal line Pre_RE.

A source electrode of the transistor Tr3 is connected to the node N3. A drain electrode of the transistor Tr3 is connected to the source electrode of the transistor Tr2. A gate electrode of the transistor Tr3 is connected to the node N1.

A source electrode of the transistor Tr4 is connected to the node N3. A drain electrode of the transistor Tr4 is connected to the node N1. A gate electrode of the transistor Tr4 is connected to a signal line Pre_reset.

The switch circuit ES_SW includes a transistor Tr5. A source electrode of the transistor Tr5 is connected to the local block connection line LBI_ce. A drain electrode of the transistor Tr5 is connected to the node N2. A gate electrode of the transistor Tr5 is connected to a signal line EO_selector.

Note that FIG. 11 illustrates the via-contact electrode CC. As described above, the local block connection line LBI_ce in the memory layer ML_E is connected to the via-contact electrode CC and is connected to the configuration in the transistor layer $L_T$ via this. On the other hand, the local block connection line LBI_co in the memory layer ML_E is not connected to the via-contact electrode CC, and therefore is not connected to the configuration in the transistor layer $L_T$.

Similarly, FIG. 12 also illustrates the via-contact electrode CC. As described above, the local block connection line LBI_ce in the memory layer ML_O is not connected to the via-contact electrode CC and therefore is not connected to the configuration in the transistor layer $L_T$. On the other hand, the local block connection line LBI_co in the memory layer ML_O is connected to the via-contact electrode CC and is connected to the configuration in the transistor layer $L_T$ via this.

As illustrated in FIG. 13 and FIG. 14, the memory layer ML includes a conductive layer 210. The hook-up region includes a plurality of insulating layers 211 arranged along the conductive layer 210.

The conductive layer 210 functions as the node N1, which has been described with reference to FIG. 11 and FIG. 12. The conductive layer 210 may include, for example, a barrier conductive layer of, for example, titanium nitride (TiN), and a conductive layer of, for example, tungsten (W).

The insulating layer 211 may contain, for example, silicon oxide ($SiO_2$). For example, as illustrated in FIG. 10, the insulating layer 211 passes through the plurality of memory layers ML and extends in the Z-direction.

As illustrated in FIG. 13 and FIG. 14, the memory layer ML includes a conductive layer 220. The hook-up region includes a plurality of insulating layers 221 arranged along the conductive layer 220.

The conductive layer 220 functions as the node N2, which has been described with reference to FIG. 11 and FIG. 12. The conductive layer 220 may include a barrier conductive layer of, for example, titanium nitride (TiN) and a conductive layer of, for example, tungsten (W).

The insulating layer 221 may contain, for example, silicon oxide ($SiO_2$). The insulating layer 221 passes through the plurality of memory layers ML and extends in the Z-direction.

As illustrated in FIG. 13 and FIG. 14, the memory layer ML includes a plurality of semiconductor layers 230. The hook-up region includes a plurality of via-electrodes 231 connected to the plurality of semiconductor layers 230.

The semiconductor layers 230 function as source regions of the transistors Tr3, Tr4, which have been described with reference to FIG. 11 and FIG. 12. The semiconductor layer 230 may contain, for example, polycrystalline silicon (Si) containing N-type impurities, such as phosphorus (P).

The via-electrode 231 functions as the node N3, which has been described with reference to FIG. 11 and FIG. 12. The via-electrode 231 may include a barrier conductive layer of, for example, titanium nitride (TiN) and a conductive layer of, for example, tungsten (W). For example, as illustrated in FIG. 10, the via-electrode 231 passes through the plurality of memory layers ML and extends in the Z-direction.

As illustrated in FIG. 13 and FIG. 14, the memory layer ML includes a plurality of semiconductor layers 240. The hook-up region includes a plurality of via-electrodes 241 disposed corresponding to the plurality of semiconductor layers 240 and insulating layers 242 that cover outer peripheral surfaces of these plurality of via-electrodes 241.

The semiconductor layers 240 function as channel regions of the transistors Tr1, Tr2, Tr4, Try, which have been described with reference to FIG. 11 and FIG. 12. The semiconductor layer 240 may contain, for example, polycrystalline silicon (Si) containing P-type impurities, such as boron (B).

The via-electrodes 241 function as gate electrodes of the transistors Tr1, Tr2, Tr4, Tr5, which have been described with reference to FIG. 11 and FIG. 12. The via-electrodes 241 function as the signal lines Pre_WE, Pre_RE, Pre_reset, EO_selector, which have been described with reference to FIG. 11 and FIG. 12. The via-electrode 241 may include a barrier conductive layer of, for example, titanium nitride (TiN) and a conductive layer of, for example, tungsten (W).

The insulating layers 242 function as gate insulating films of the transistors Tr1, Tr2, Tr4, Tr5, which have been described with reference to FIG. 11 and FIG. 12. The insulating layer 242 may contain, for example, silicon oxide ($SiO_2$). For example, as illustrated in FIG. 10, the via-electrode 241 and the insulating layer 242 pass through the plurality of memory layers ML and extend in the Z-direction.

As illustrated in FIG. 13 and FIG. 14, the memory layer ML includes a semiconductor layer 250 connected to a part of an outer peripheral surface of the semiconductor layer 230 and an insulating layer 251 connected to a part of the outer peripheral surface of the semiconductor layer 250. The hook-up region includes an insulating layer 252 connected to the semiconductor layer 250 and a semiconductor layer 253 connected to a part of the outer peripheral surface of the semiconductor layer 250.

The semiconductor layer 250 functions as a channel region of the transistor Tr3, which has been described with reference to FIG. 11 and FIG. 12. The semiconductor layer 250 may contain, for example, polycrystalline silicon (Si) containing P-type impurities, such as boron (B).

The insulating layer 251 functions as a gate insulating film of the transistor Tr3, which has been described with reference to FIG. 11 and FIG. 12. The insulating layer 251 may contain, for example, silicon oxide ($SiO_2$).

The insulating layer 252 may contain, for example, silicon oxide ($SiO_2$). The insulating layer 252 passes through the plurality of memory layers ML and extends in the Z-direction.

The semiconductor layer 253 reduces a leak current in the transistor Tr3 configured of the semiconductor layer 250 and the like. The semiconductor layer 253 may contain, for example, polycrystalline silicon (Si) containing P-type impurities, such as boron (B). A concentration of the impurities contained in the semiconductor layer 253 is larger than a concentration of the impurities contained in the semiconductor layer 250. The semiconductor layer 253 passes through the plurality of memory layers ML and extends in the Z-direction.

As illustrated in FIG. 13 and FIG. 14, the memory layer ML includes a plurality of semiconductor layers 260. The hook-up region includes a plurality of insulating layers 261 connected to the plurality of semiconductor layers 260.

A part of the plurality of semiconductor layers 260 is connected to the conductive layer 210 and the semiconductor layer 240. The semiconductor layers 260 function as the drain regions of the transistors Tr1, Tr4, which have been described with reference to FIG. 11 and FIG. 12.

A part of the plurality of semiconductor layers 260 is connected to the two semiconductor layers 240 and the conductive layer 220. The semiconductor layers 260 function as the source region of the transistor Tr1 and the drain region of the transistor Tr2, which have been described with reference to FIG. 11 and FIG. 12.

A part of the plurality of semiconductor layers 260 is connected to the semiconductor layer 240 and the semiconductor layer 250. The semiconductor layers 260 function as the source region of the transistor Tr2 and the drain region of the transistor Tr3, which have been described with reference to FIG. 11 and FIG. 12.

A part of the plurality of semiconductor layers 260 is connected to the conductive layer 220 and the semiconductor layer 240. The semiconductor layer 260 functions as the drain region of the transistor Tr5, which has been described with reference to FIG. 11 and FIG. 12.

A part of the plurality of semiconductor layers 260 is connected to the conductive layer 190 and the conductive layer 240. The semiconductor layer 260 functions as the source region of the transistor Tr5, which has been described with reference to FIG. 11 and FIG. 12.

The semiconductor layer 260 may contain, for example, polycrystalline silicon (Si) containing N-type impurities, such as phosphorus (P).

The insulating layer 261 may contain, for example, silicon oxide ($SiO_2$). For example, as illustrated in FIG. 10, the insulating layer 261 passes through the plurality of memory layers ML and extends in the Z-direction.

As illustrated in FIG. 13 and FIG. 14, the memory layer ML includes a semiconductor layer 270. The semiconductor layer 270 is opposed to the semiconductor layer 250 via the insulating layer 251 and connected to the conductive layer 210. In the hook-up region, an insulating layer 271 connected to the semiconductor layer 270 is disposed.

The semiconductor layer 270 functions as the gate electrode of the transistor Tr3, which has been described with reference to FIG. 11 and FIG. 12. The semiconductor layer 270 may contain, for example, polycrystalline silicon (Si) containing N-type impurities, such as phosphorus (P). The insulating layer 271 may contain, for example, silicon oxide ($SiO_2$). The insulating layer 271 passes through the plurality of memory layers ML and extends in the Z-direction.

[Configuration in Transistor Layer $L_T$]

Figure 15:
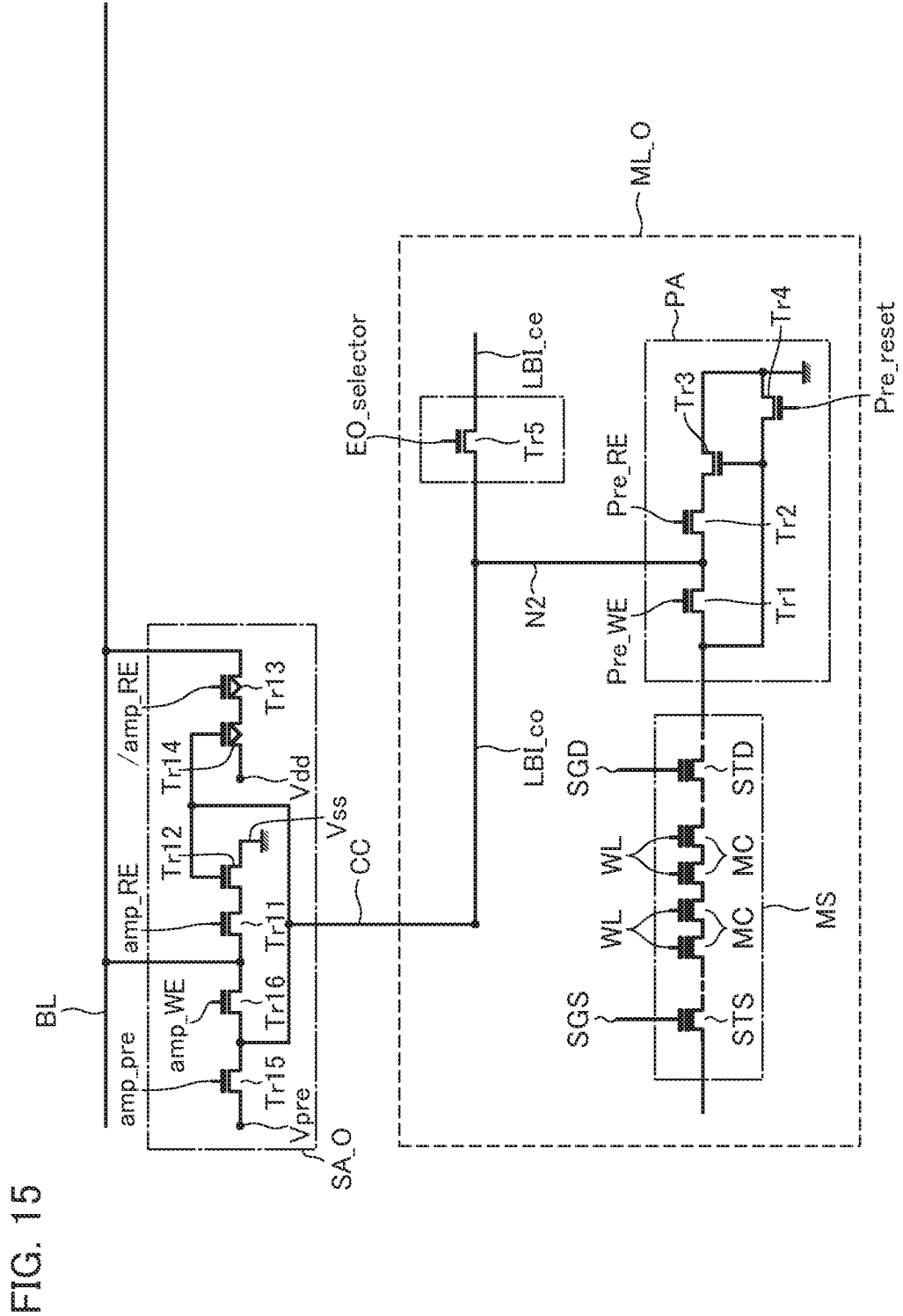
FIG. 15 is a schematic circuit diagram illustrating a configuration of a part of the semiconductor memory device.
Figure 16:
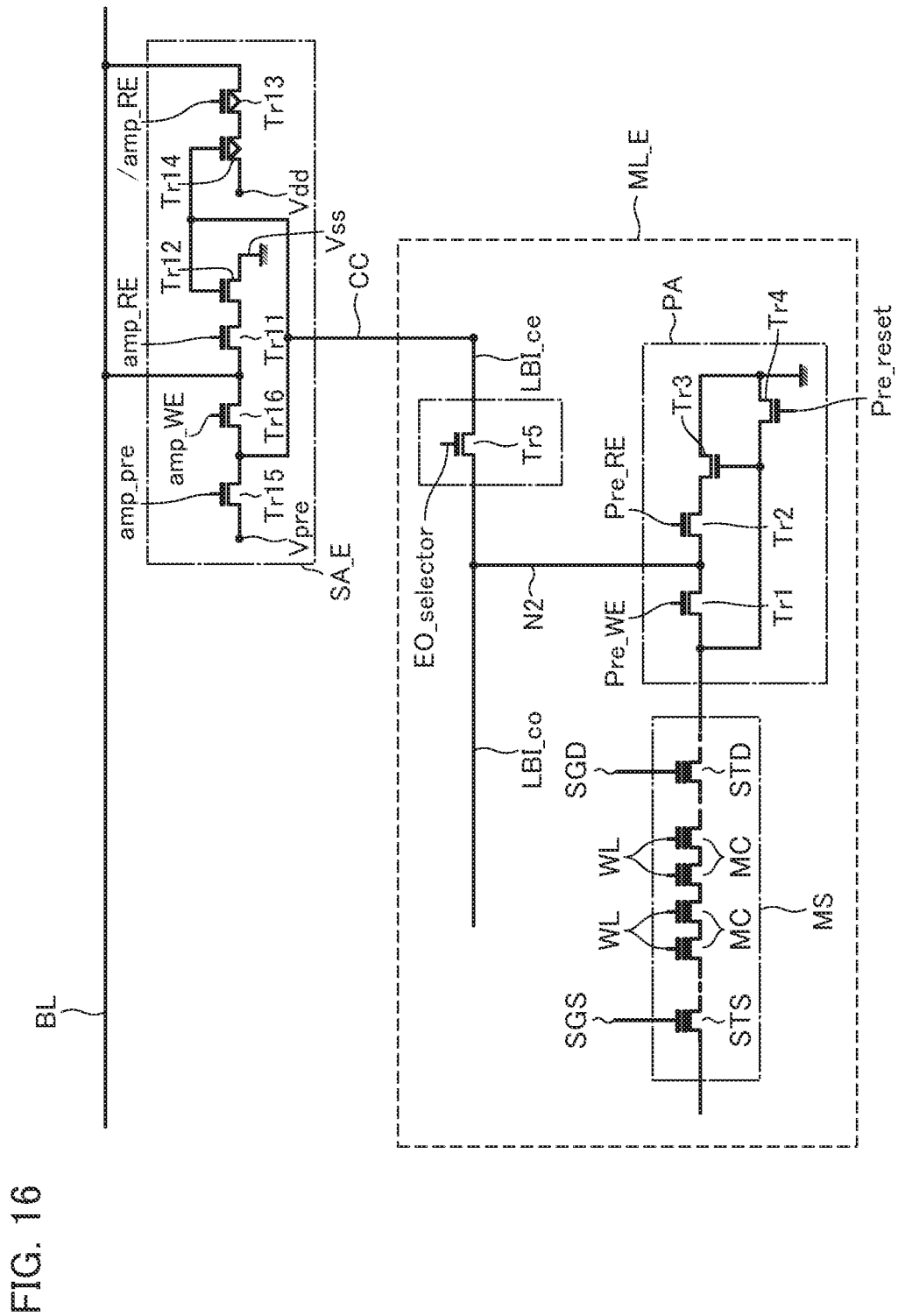
FIG. 16 is a schematic circuit diagram illustrating a configuration of a part of the semiconductor memory device.

FIG. 15 and FIG. 16 are schematic circuit diagrams illustrating a configuration of a part of the semiconductor memory device according to the embodiment.

The transistor layer $L_T$ includes a plurality of sense amplifier circuits SA_O disposed corresponding to the plurality of memory layers ML_O and a plurality of sense amplifier circuits SA_E disposed corresponding to the plurality of memory layers ML_E.

As illustrated in FIG. 15, the sense amplifier circuit SA_O is connected to the bit line BL and the local block connection line LBI_co in the memory layer ML_O.

The sense amplifier circuit SA_O includes transistors Tr11, Tr12 connected in series between the bit line BL and a voltage node Vss, transistors Tr13, Tr14 connected in series between the bit line BL and a voltage node Vdd, a transistor Tr15 connected between a voltage node Vpre and the via-contact electrode CC, and a transistor Tr16 connected between the bit line BL and the via-contact electrode CC. The transistors Tr11, Tr12, Tr15, Tr16, for example, are N-channel type field effect transistors. The transistors Tr13, Tr14, for example, are P-channel type field effect transistors.

A source electrode of the transistor Tr11 is connected to a drain electrode of the transistor Tr12. A drain electrode of the transistor Tr11 is connected to the bit line BL. A gate electrode of the transistor Tr11 is connected to a signal line amp_RE. A source electrode of the transistor Tr12 is connected to the voltage node Vss. A gate electrode of the transistor Tr12 is connected to the via-contact electrode CC.

A source electrode of the transistor Tr13 is connected to the drain electrode of the transistor Tr14. A drain electrode of the transistor Tr13 is connected to the bit line BL. A gate electrode of the transistor Tr13 is connected to a signal line/amp_RE. A source electrode of the transistor Tr14 is connected to the voltage node Vdd. A gate electrode of the transistor Tr14 is connected to the via-contact electrode CC.

A source electrode of the transistor Tr15 is connected to the via-contact electrode CC. A drain electrode of the transistor Tr15 is connected to the voltage node Vpre. A gate electrode of the transistor Tr15 is connected to a signal line amp_pre.

A source electrode of the transistor Tr16 is connected to the via-contact electrode CC. A drain electrode of the transistor Tr16 is connected to the bit line BL. A gate electrode of the transistor Tr16 is connected to a signal line amp_WE.

As illustrated in FIG. 16, the sense amplifier circuit SA_E is connected to the bit line BL and the local block connection line LBI_ce in the memory layer ML_E. The sense amplifier circuit SA_E is configured similarly to the sense amplifier circuit SA_O.

Note that the sense amplifier circuit SA_O and the sense amplifier circuit SA_E are controllable independently from one another. That is, each of the signal lines amp_RE, /amp_RE, amp_pre, amp_WE corresponding to the sense amplifier circuit SA_E is electrically independent from the signal lines amp_RE, /amp_RE, amp_pre, amp_WE corresponding to the sense amplifier circuit SA_O, and different signals can be input.

[Read Operation]

Figure 17:
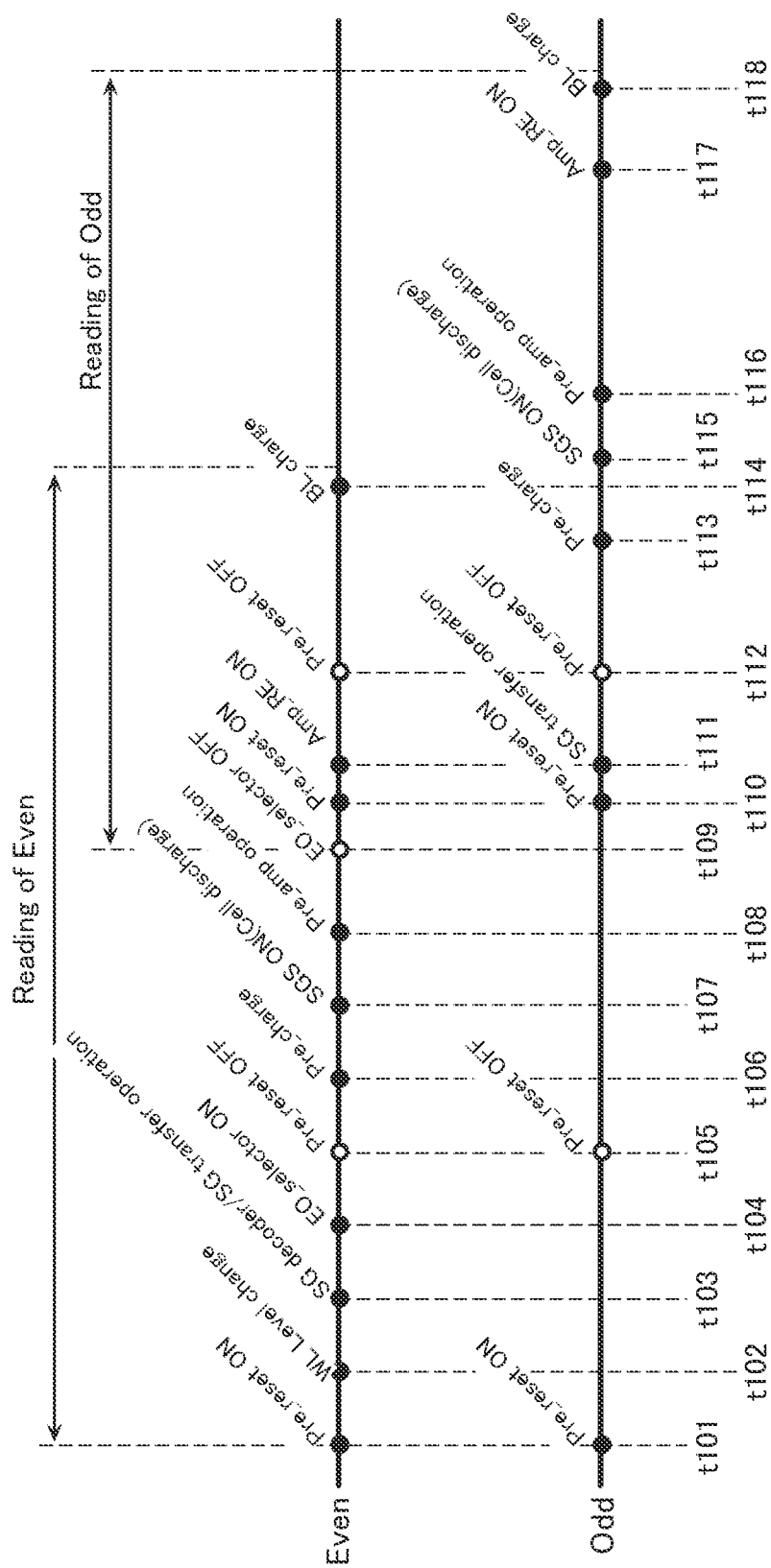
FIG. 17 is a schematic timing chart for describing a read operation of the semiconductor memory device.

FIG. 17 is a schematic timing chart for describing the read operation of the semiconductor memory device according to the embodiment. FIG. 18 to FIG. 33 are schematic circuit diagrams for describing the read operation of the semiconductor memory device according to the embodiment.

Note that FIG. 18 to FIG. 33 summarize the configurations in the plurality of memory layers ML_E, ML_O and the plurality of bit lines BL corresponding to them to one. For each wiring in the drawing, a state of a voltage is indicated like ($V_E/V_O$). The first voltage $V_E$ indicates the state of the voltage of the wiring included in the memory layer ML_E or the bit line BL corresponding to the memory layer ML_E. The second voltage $V_O$ indicates the state of the voltage of the wiring included in the memory layer ML_O or the bit line BL corresponding to the memory layer ML_O.

In FIG. 18 to FIG. 33, the sense amplifier circuit SA_E is connected to the bit line BL and the local block connection line LBI_ce. However, as described with reference to FIG. 15 and FIG. 16, the sense amplifier circuit SA_E is connected to only the bit line BL corresponding to the memory layer ML_E and the local block connection line LBI_ce and is not connected to the bit line BL corresponding to the memory layer ML_O or the local block connection line LBI_ce.

Similarly, in FIG. 18 to FIG. 33, the sense amplifier circuit SA_O is connected to the bit line BL and the local block connection line LBI_co. However, as described with reference to FIG. 15 and FIG. 16, the sense amplifier circuit SA_O is connected to only the bit line BL corresponding to the memory layer ML_O and the local block connection line LBI_co and is not connected to the bit line BL corresponding to the memory layer ML_E or the local block connection line LBI_co.

Figure 18:
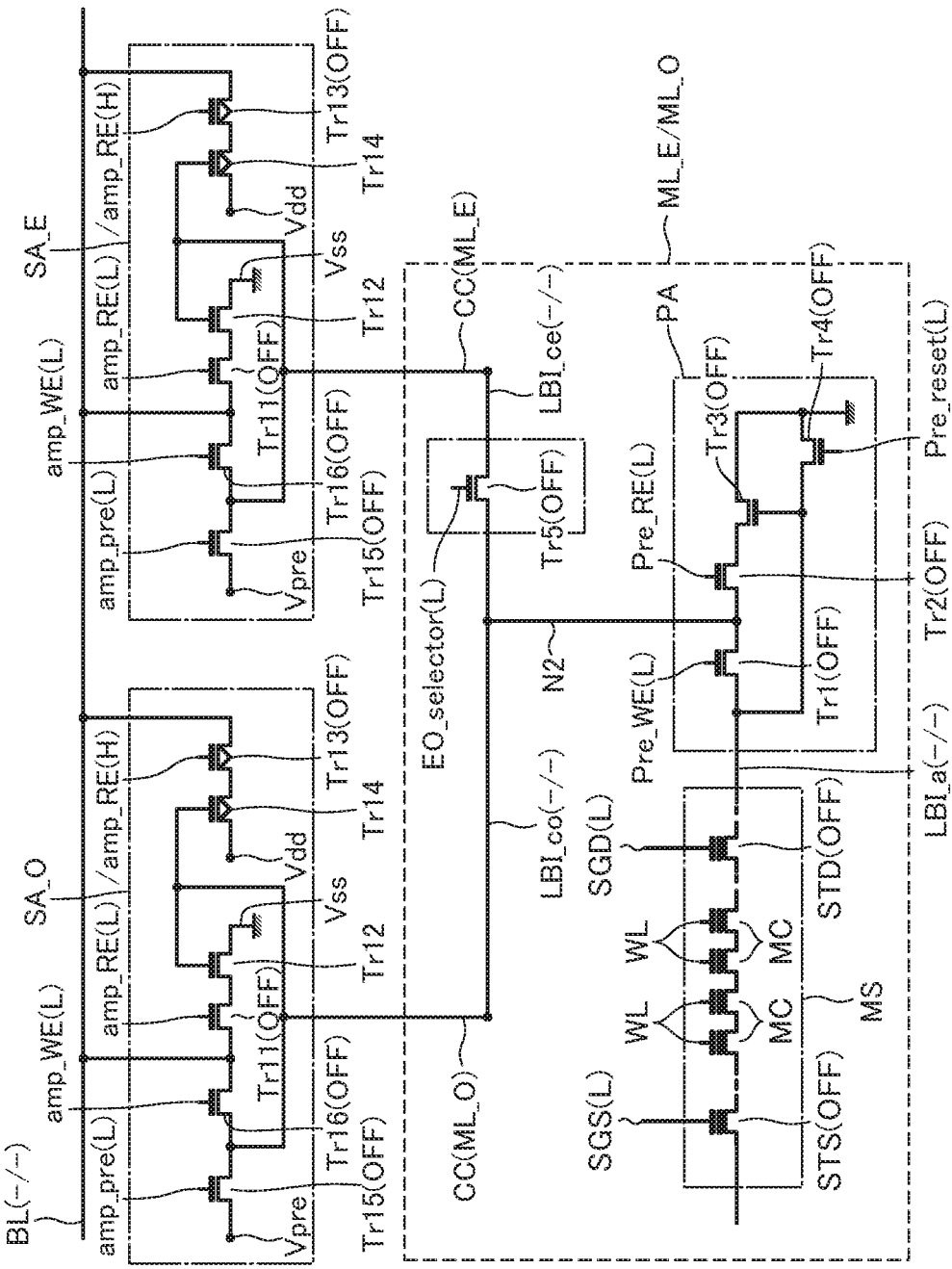
FIG. 18 is a schematic circuit diagram for describing the read operation.

At a timing of starting the read operation, as illustrated in FIG. 18, the voltage of the drain-side select gate line SGD, the source-side select gate line SGS, and the word lines WL corresponding to the memory string MS target for the read operation is set to "L".

Additionally, the voltages of the signal lines Pre_WE, Pre_RE, Pre_reset corresponding to the pre-amplifier circuit PA are set to "L, L, L".

The voltage of the signal line EO_selector corresponding to the switch circuit ES_SW is set to "L".

The voltages of the signal lines amp_RE, /amp_RE, amp_pre, amp_WE corresponding to the sense amplifier circuit SA_E, SA_O are set to "L, H, L, L".

Figure 19:
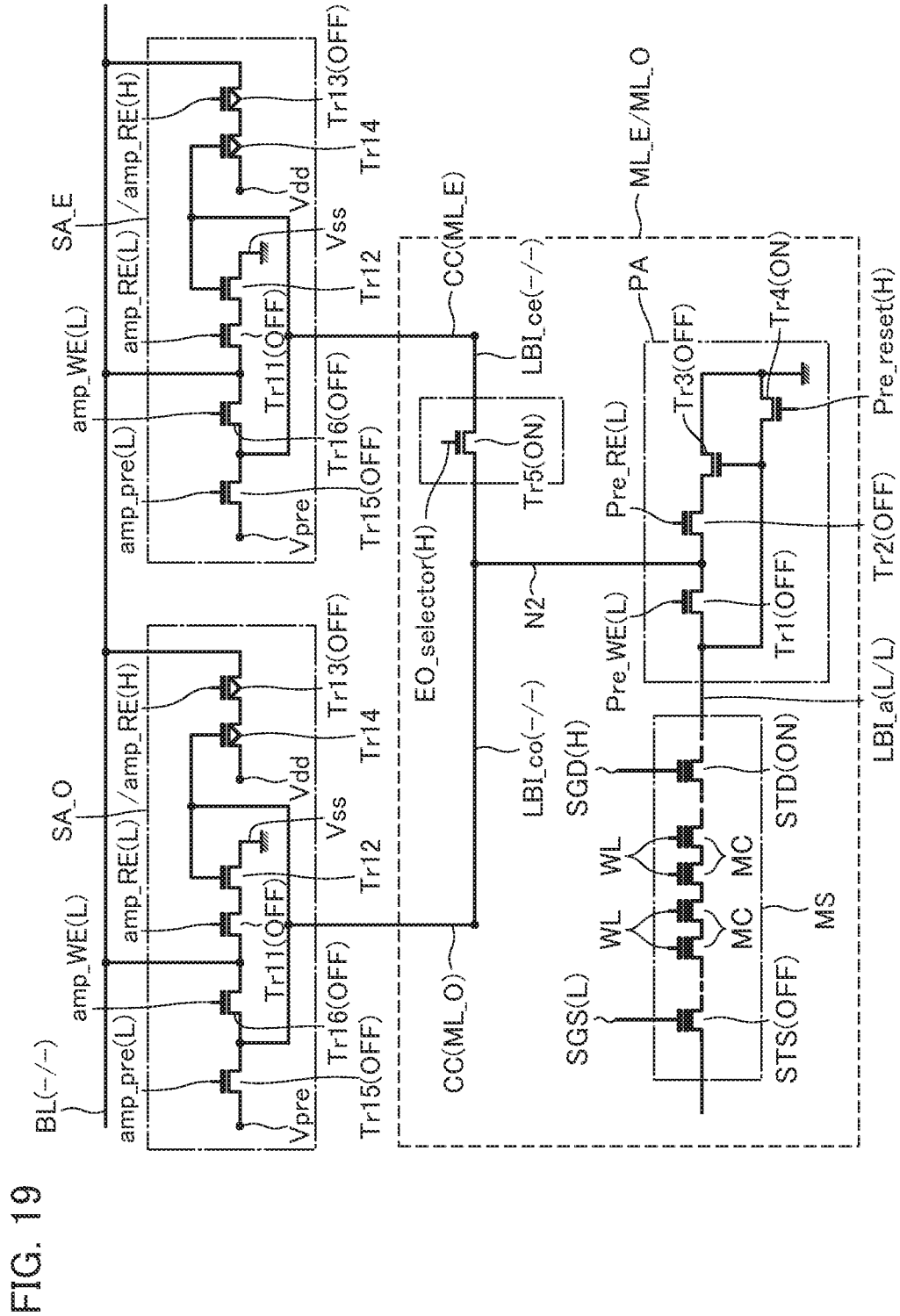
FIG. 19 is a schematic circuit diagram for describing the read operation.

At timing t101 in the read operation, the local block connection line LBI_a in the memory layer ML_E, ML_O is discharged. For example, as illustrated in FIG. 19, the voltage of the signal line Pre_reset is set to "H". Thus, the transistor Tr4 enters the ON state, and the voltage of the local block connection line LBI_a in the memory layer ML_E, ML_O becomes "L".

At timing t102 in the read operation, the voltage of the word line WL is adjusted. For example, the voltage of the selected word line WL is set to a predetermined read voltage. The read voltage is a voltage having a magnitude around the memory cell MC entering the ON state or the OFF state according to data stored in the memory cell MC. Additionally, the voltage of the unselected word line WL is set to a read pass voltage. The read pass voltage is a voltage having a magnitude around the memory cell MC entering the ON state regardless of the data stored in the memory cell MC.

At timing t103 in the read operation, for example, as illustrated in FIG. 19, the voltage of the drain-side select gate line SGD is set to "H". Thus, the drain-side select gate line SGD enters the ON state and the voltage in the memory string MS in the memory layer ML_E, ML_O becomes "L".

At timing t104 in the read operation, for example, as illustrated in FIG. 19, the voltage of the signal line EO_selector is set to "H". Thus, the transistor Try enters the ON state.

Figure 20:
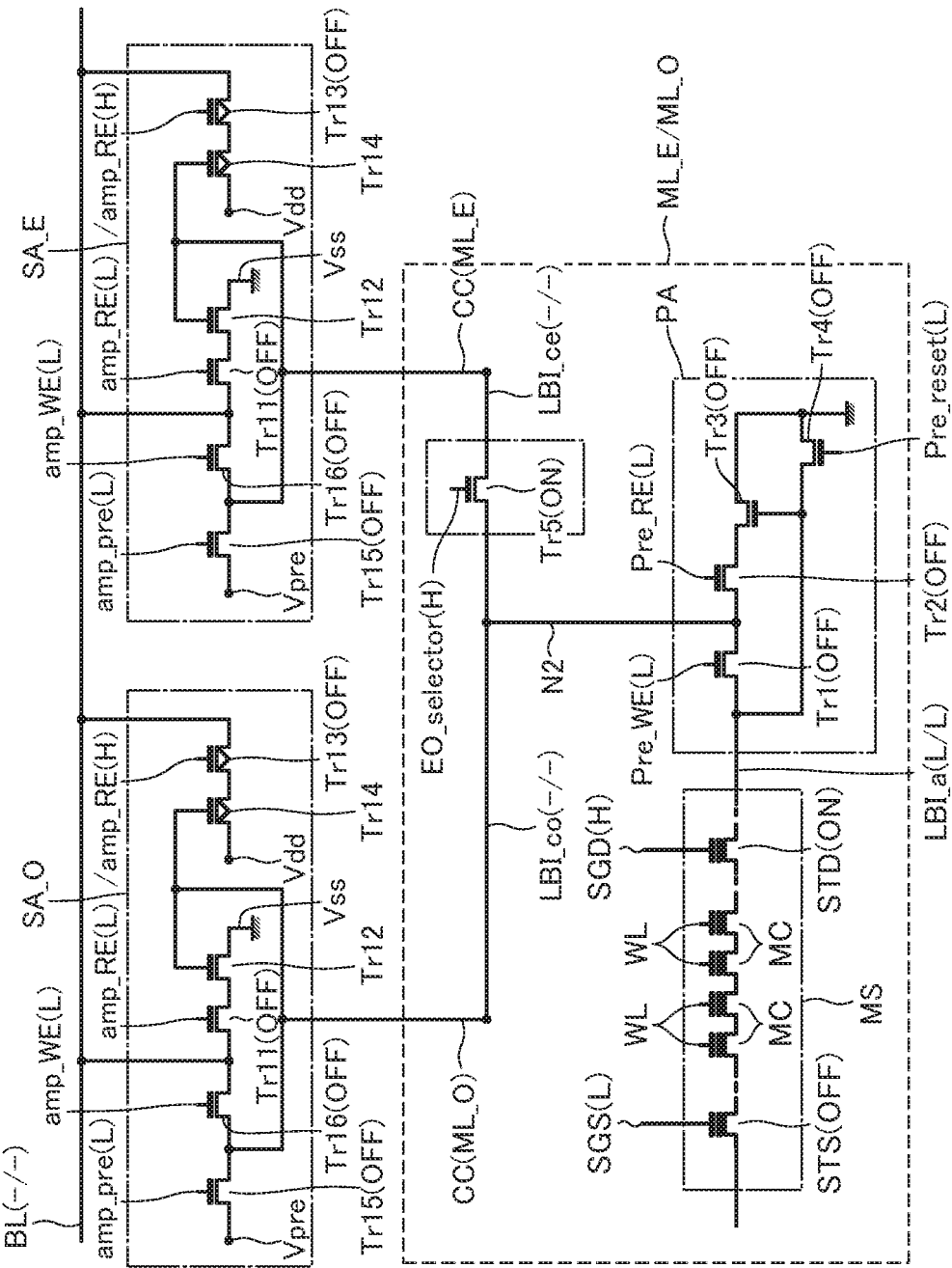
FIG. 20 is a schematic circuit diagram for describing the read operation.

At timing t105 in the read operation, discharge of the local block connection line LBI_a in the memory layer ML_E, ML_O ends. For example, as illustrated in FIG. 20, the voltage of the signal line Pre_reset is set to "L". Thus, the transistor Tr4 enters the OFF state.

Figure 21:
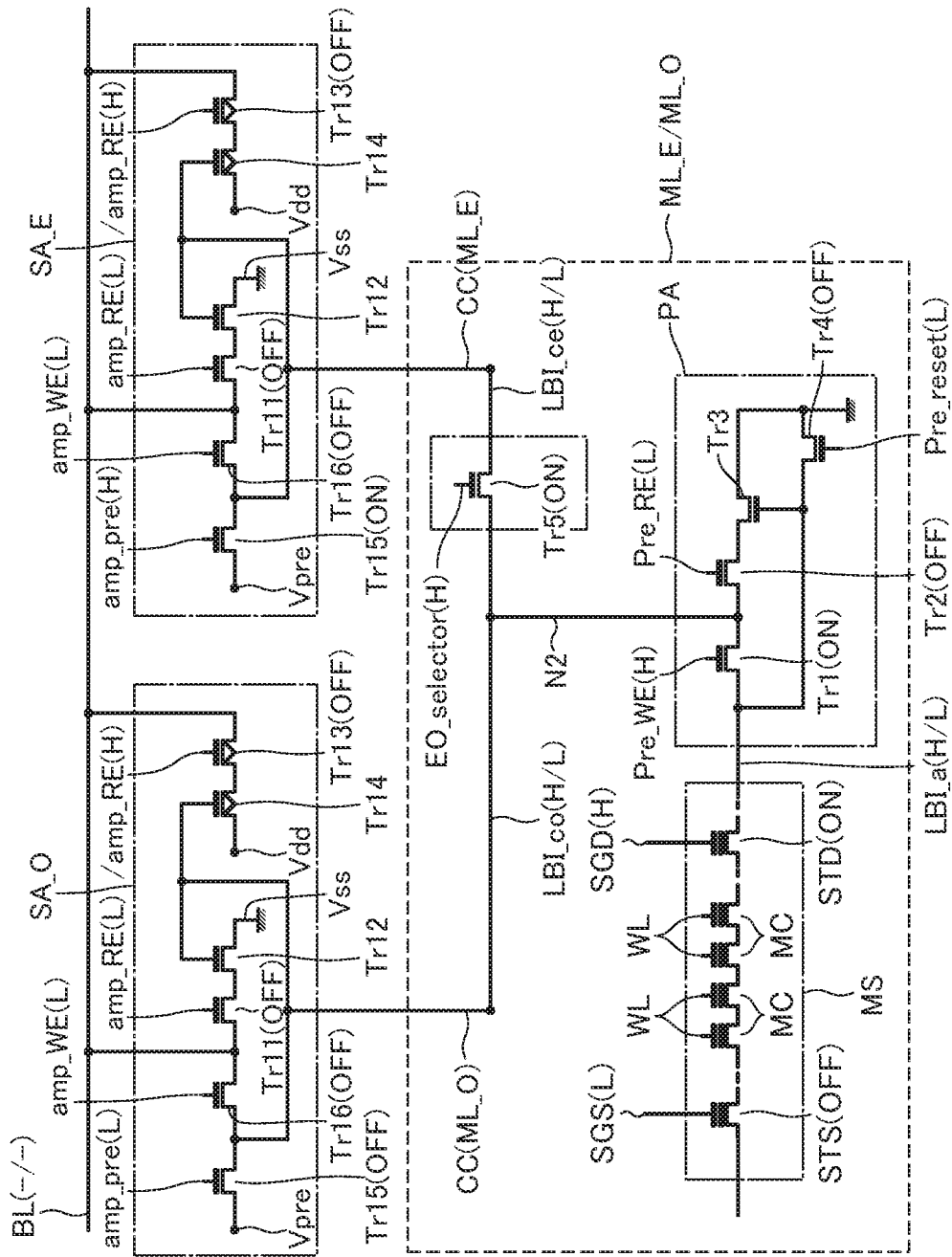
FIG. 21 is a schematic circuit diagram for describing the read operation.

At timing t106 in the read operation, a precharge operation is performed. For example, as illustrated in FIG. 21, the signal line Pre_WE and the signal line amp_pre corresponding to the sense amplifier circuit SA_E are set to "H". Thus, the transistor Tr1 and the transistor Tr15 corresponding to the sense amplifier circuit SA_E enter the ON state. In association with this, the voltages in the local block connection lines LBI_ce, LBI_co, LBI_a and the memory string MS in the memory layer ML_E become "H". Additionally, the voltages in the local block connection lines LBI_ce, LBI_co, LBI_a and the memory string MS in the memory layer ML_O become "L".

Figure 22:
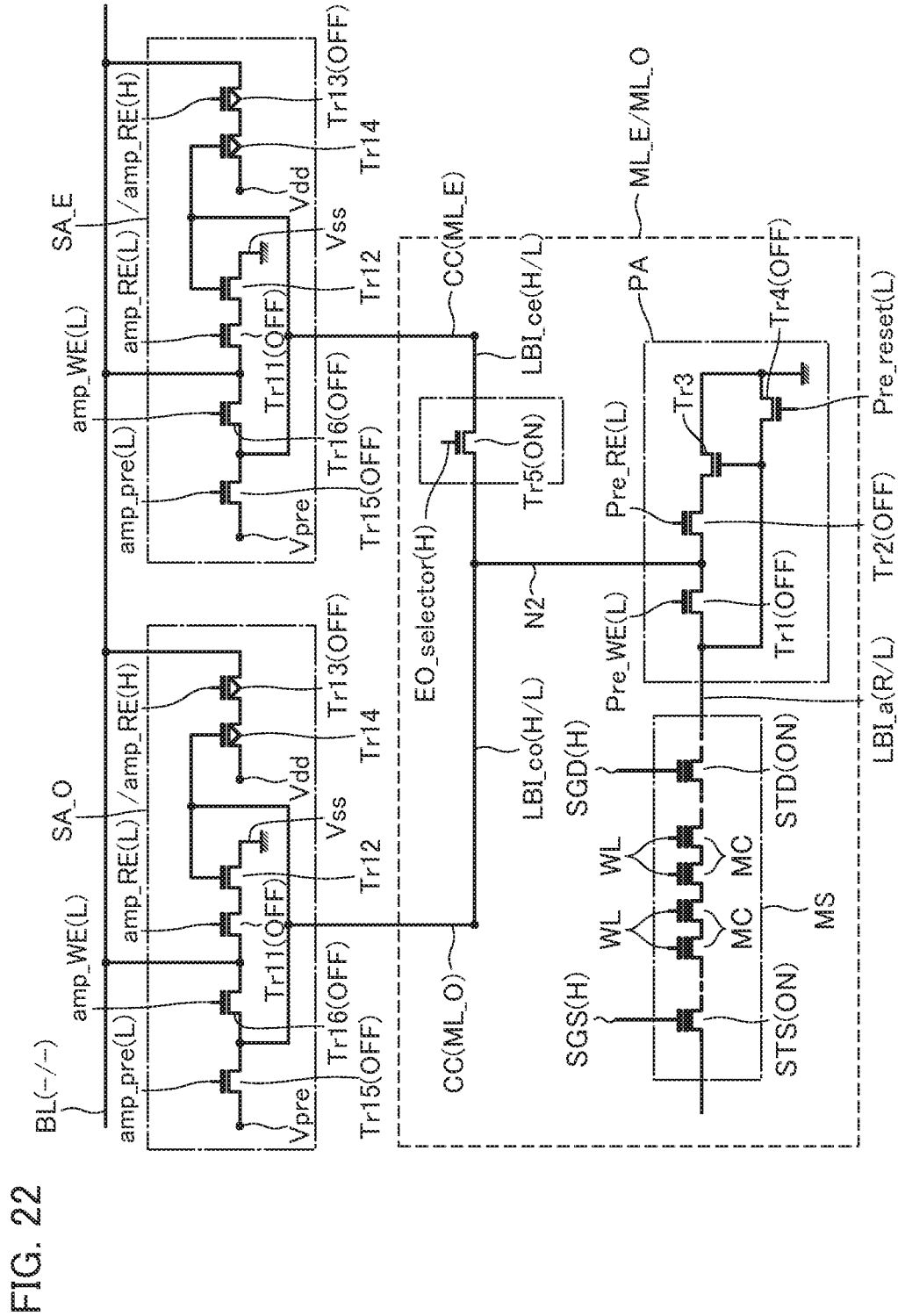
FIG. 22 is a schematic circuit diagram for describing the read operation.

At timing t107 in the read operation, the precharge operation ends. For example, as illustrated in FIG. 22, the signal line Pre_WE and the signal line amp_pre corresponding to the sense amplifier circuit SA_E are set to "L". Thus, the transistor Tr1 and the transistor Tr15 corresponding to the sense amplifier circuit SA_E enter the OFF state.

At timing t107 in the read operation, a discharge operation is performed. For example, as illustrated in FIG. 22, the voltage of the source-side select gate line SGS is set to "H". Thus, the source-side select transistor STS enters the ON state.

Here, in the memory layer ML_E, read data R is read. That is, in the memory layer ML_E, the voltages in the local block connection line LBI_a and the memory string MS are "H". Therefore, when a threshold voltage of the selected memory cell MC is smaller than the read voltage, electric charges in the local block connection line LBI_a and the memory string MS are discharged, and these voltages become "L". In this case, the transistor Tr3 enters the OFF state. Moreover, when the threshold voltage of the selected memory cell MC is larger than the read voltage, the electric charge in the local block connection line LBI_a or the memory string MS is not discharged and these voltages are maintained to be "H". In this case, the transistor Tr3 enters the ON state.

On the other hand, in the memory layer ML_O, the voltages in the local block connection line LBI_a and the memory string MS are "L". Accordingly, regardless of the threshold voltage of the selected memory cell MC, the voltages of the local block connection line LBI_a and the memory string MS are maintained to be "L". Accordingly, the transistor Tr3 enters the OFF state.

Figure 23:
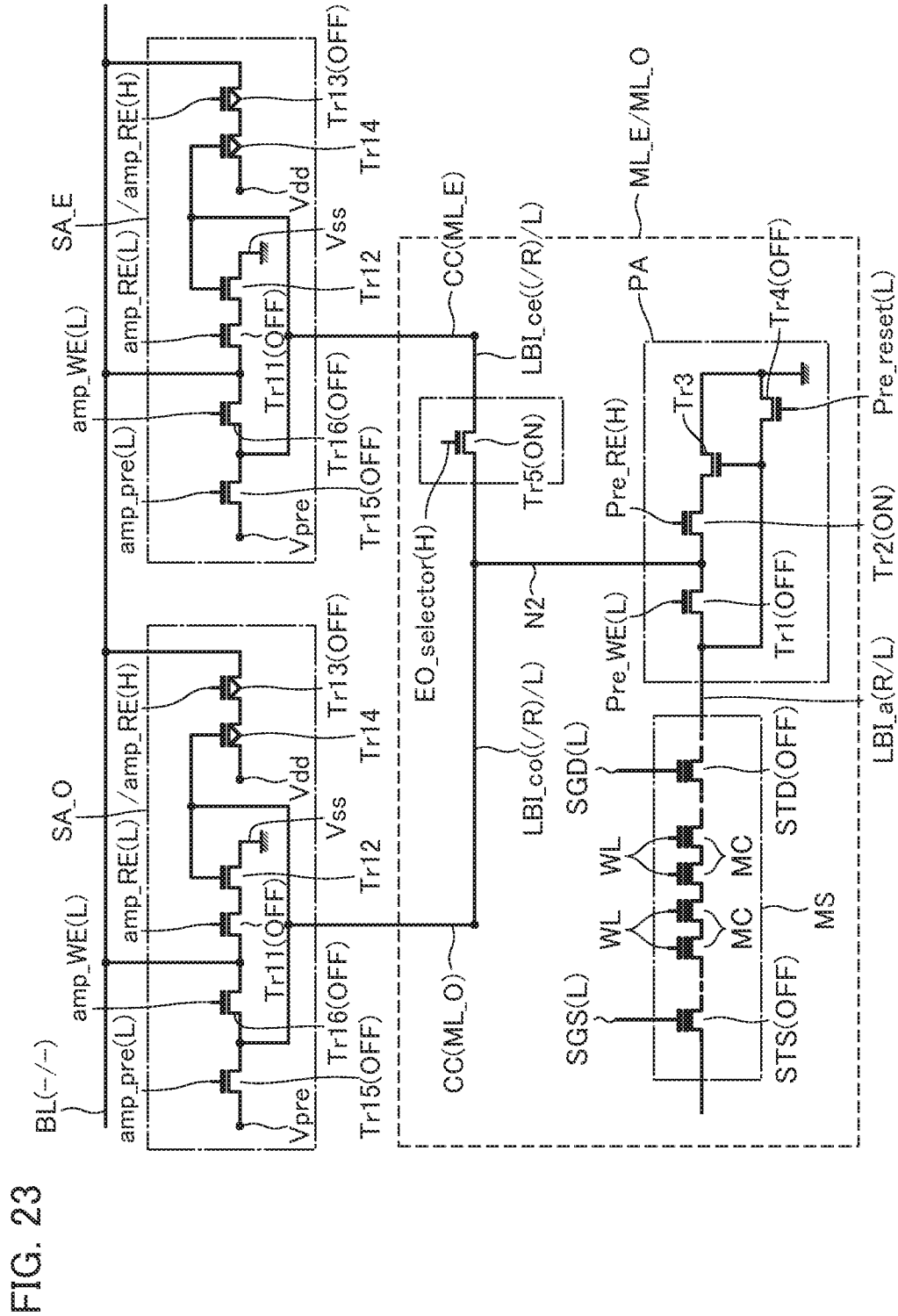
FIG. 23 is a schematic circuit diagram for describing the read operation.

At timing t108 in the read operation, the discharge operation ends. For example, as illustrated in FIG. 23, the voltages of the word lines WL, the drain-side select gate line SGD, and the source-side select gate line SGS are set to "L". Thus, the memory cell MC, the drain-side select gate line SGD, and the source-side select transistor STS enter the OFF state.

Additionally, at timing t108 in the read operation, a pre-amplifier operation is performed. For example, as illustrated in FIG. 23, the voltage of the signal line Pre_RE is set to "H". Thus, the transistor Tr2 enters the ON state.

Here, the read data R corresponding to the memory layer ML_E is transferred to the sense amplifier circuit SA_E as inverted data/R. That is, in the memory layer ML_E, when the transistor Tr3 is in the ON state, a ground voltage is applied to the node N2. Accordingly, the voltage of the node N2 becomes "L". In this case, the transistor Tr12 in the sense amplifier circuit SA_E enters the OFF state. Additionally, the transistor Tr14 in the sense amplifier circuit SA_E enters the ON state. On the other hand, when the transistor Tr3 is in the OFF state, the ground voltage is not applied to the node N2. Accordingly, the voltage of the node N2 is maintained to be "H". In this case, the transistor Tr12 in the sense amplifier circuit SA_E enters the ON state. Additionally, the transistor Tr14 in the sense amplifier circuit SA_E enters the OFF state.

Note that, in the memory layer ML_O, the transistor Tr3 is in the OFF state. Additionally, the voltage of the node N2 is maintained to be "H".

Figure 24:
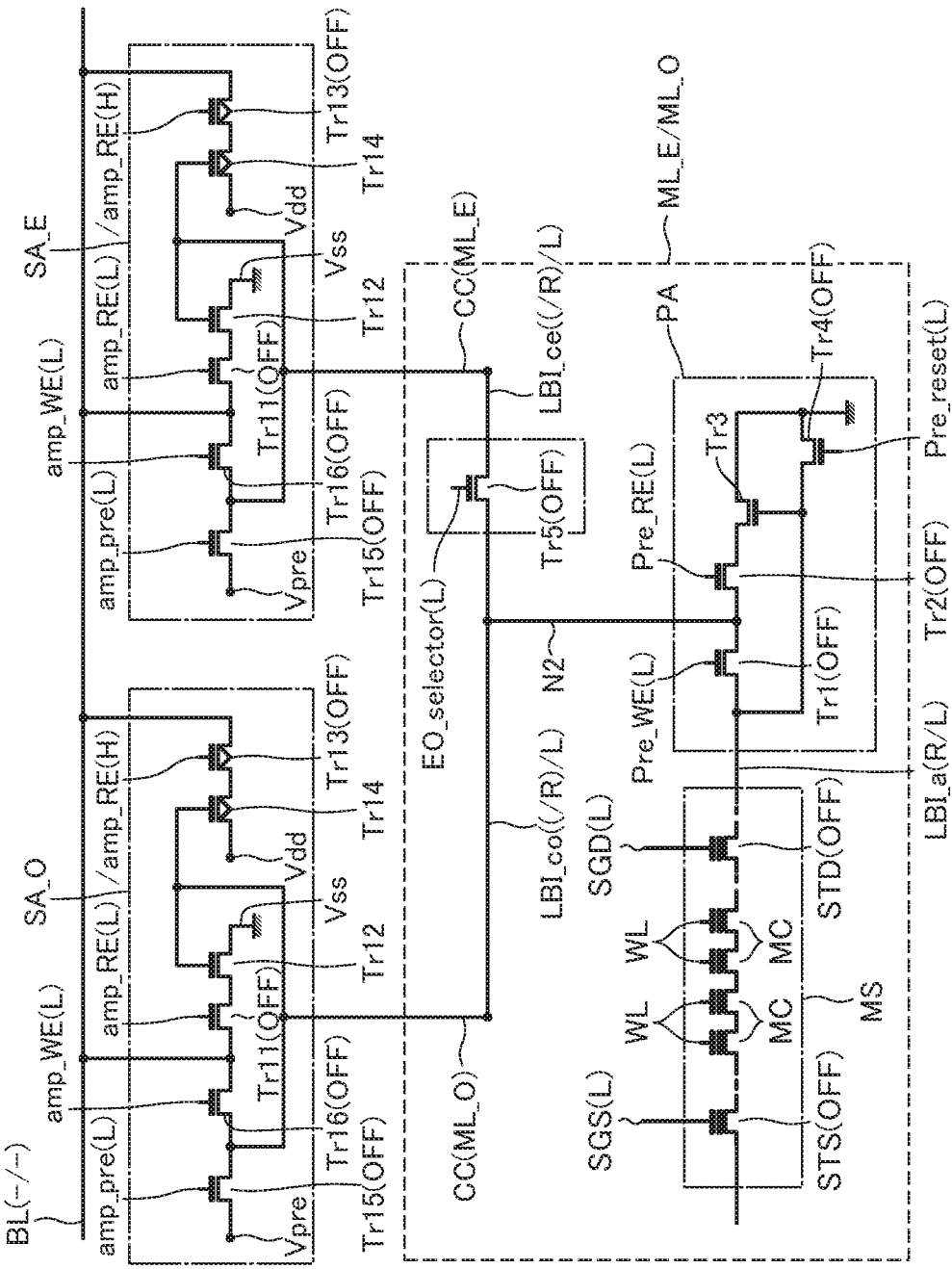
FIG. 24 is a schematic circuit diagram for describing the read operation.

At timing t109 in the read operation, for example, as illustrated in FIG. 24, the voltage of the signal line EO_selector is set to "L". Thus, the transistor Try enters the OFF state.

Figure 25:
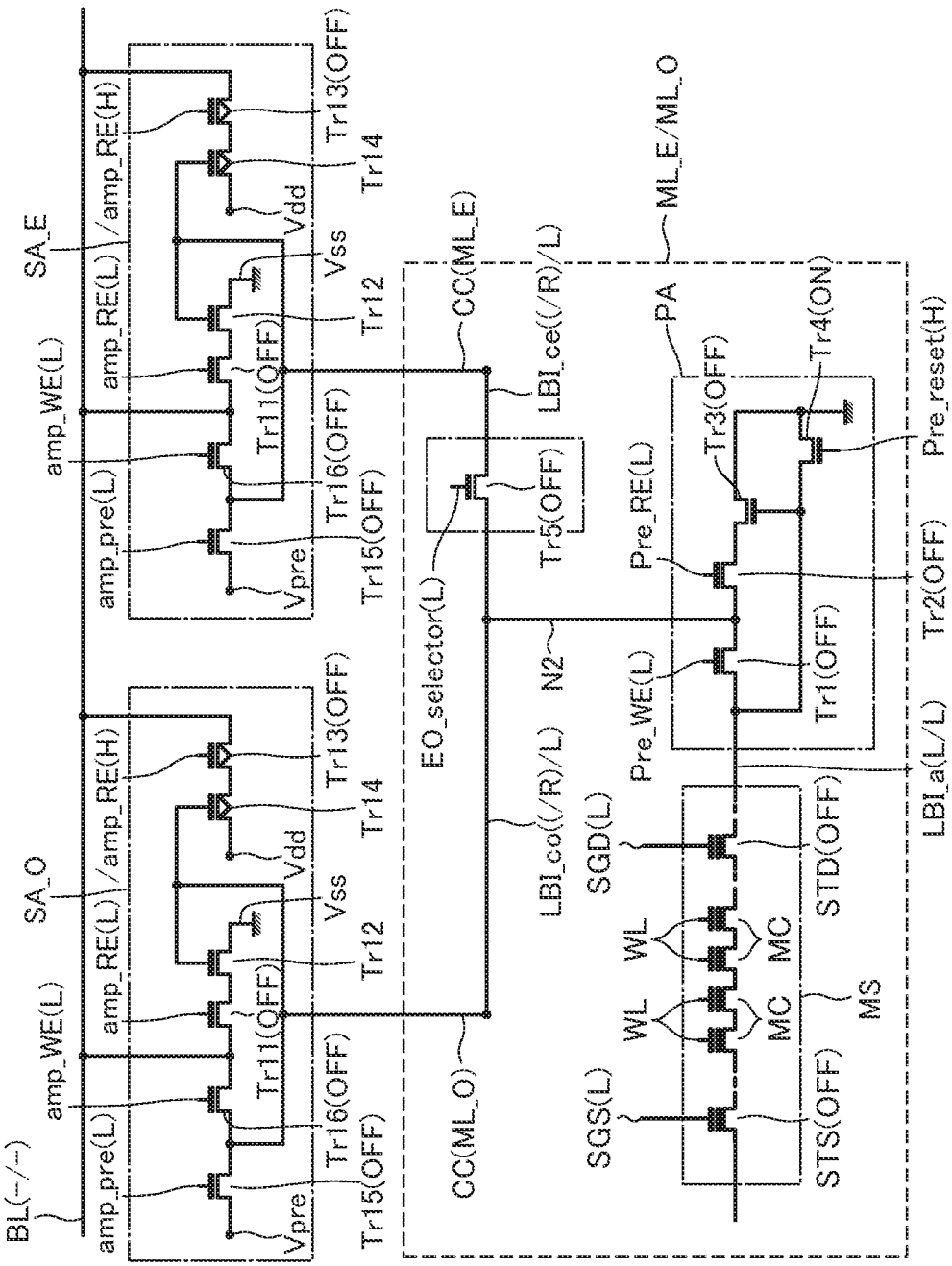
FIG. 25 is a schematic circuit diagram for describing the read operation.

At timing t110 in the read operation, the local block connection line LBI_a in the memory layer ML_E, ML_O is discharged. For example, as illustrated in FIG. 25, a voltage of the signal line Pre_reset is set to "H". Thus, the transistor Tr4 enters an ON state, and a voltage of the local block connection line LBI_a in the memory layer ML_E, ML_O becomes "L".

Figure 26:
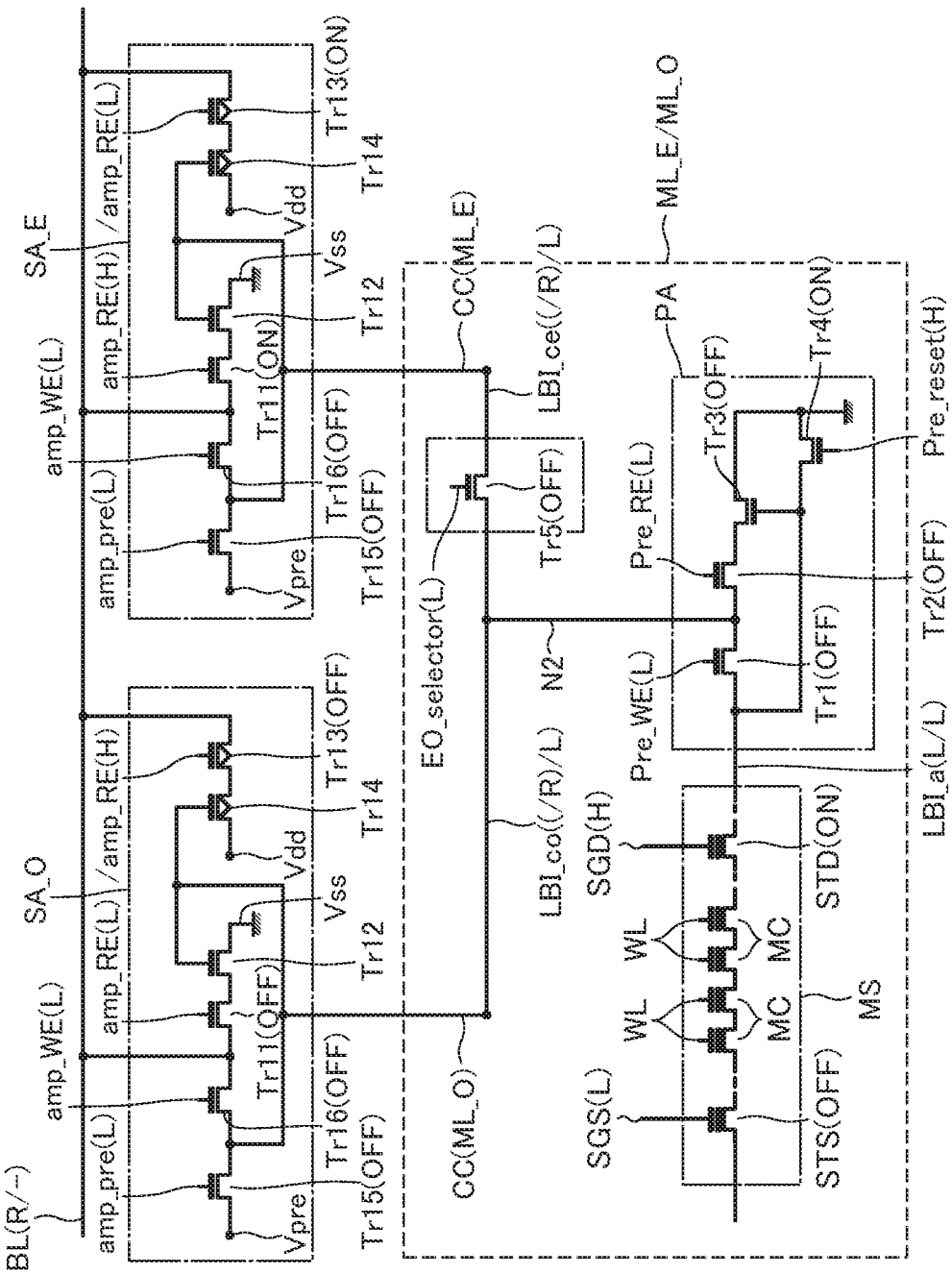
FIG. 26 is a schematic circuit diagram for describing the read operation.

At timing t111 in the read operation, an amplifier operation is performed. For example, as illustrated in FIG. 26, the signal lines amp_RE, /amp_RE corresponding to the sense amplifier circuit SA_E are set to "H, L". Thus, the transistors Tr11, Tr13 in the sense amplifier circuit SA_E enter the ON state.

Here, the inverted data/R corresponding to the memory layer ML_E is transferred to the bit line BL as the read data R. That is, in the sense amplifier circuit SA_E, when the transistor Tr12 is in the OFF state and the transistor Tr14 is in the ON state, the voltage of the bit line BL becomes "H". On the other hand, in the sense amplifier circuit SA_E, when the transistor Tr12 is in the ON state and the transistor Tr14 is in the OFF state, the voltage of the bit line BL becomes "L". Note that the read data R transferred to the bit line BL is further transferred to a circuit (not illustrated).

Additionally, at timing t111 in the read operation, for example, as illustrated in FIG. 26, the voltage of the drain-side select gate line SGD is set to "H". Thus, the drain-side select gate line SGD enters the ON state and the voltage in the memory string MS in the memory layer ML_E, ML_O becomes "L".

Figure 27:
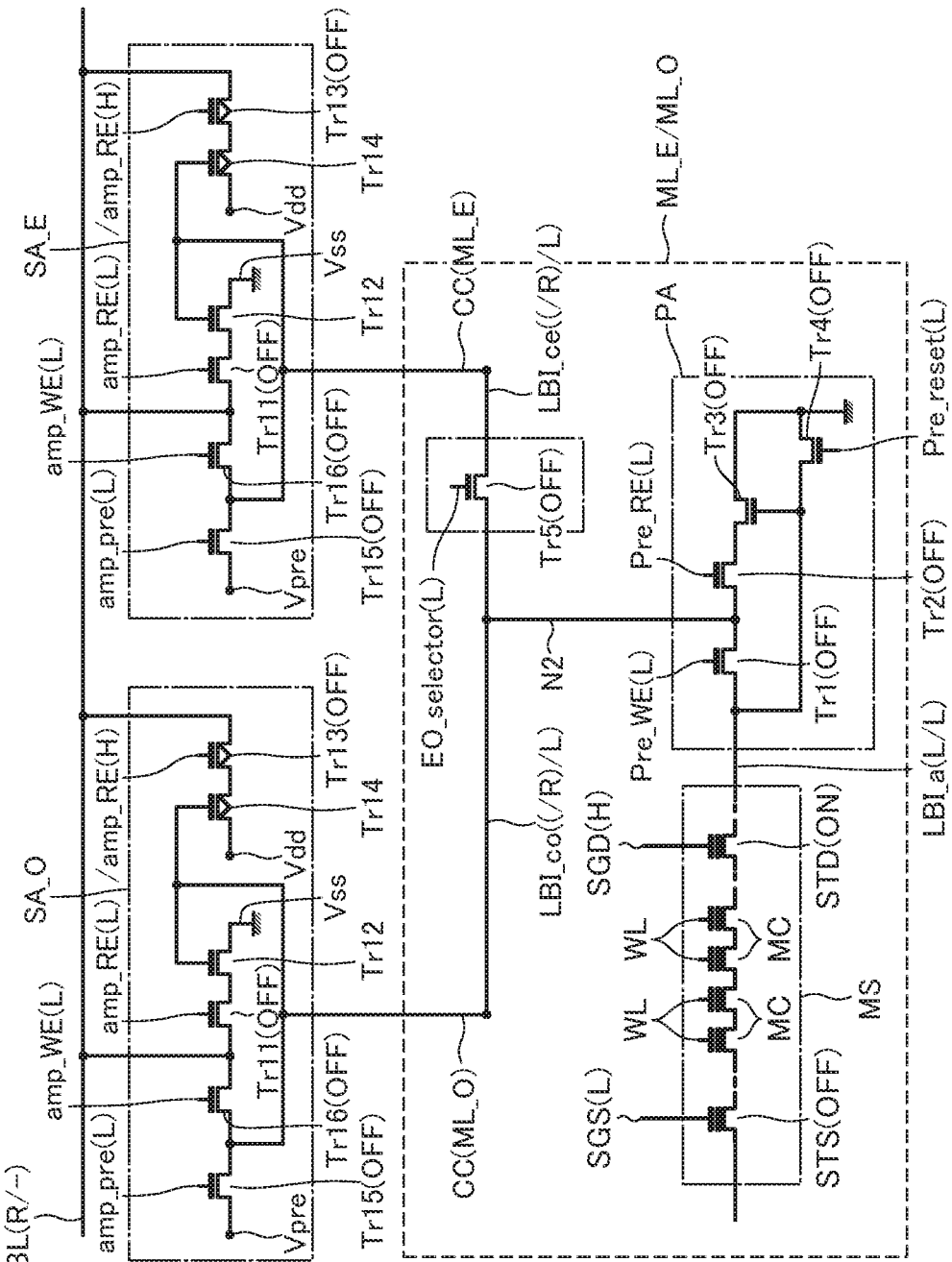
FIG. 27 is a schematic circuit diagram for describing the read operation.

At timing t112 in the read operation, the amplifier operation ends. For example, as illustrated in FIG. 27, the signal lines amp_RE, /amp_RE corresponding to the sense amplifier circuit SA_E are set to "L, H". Thus, the transistors Tr11, Tr13 in the sense amplifier circuit SA_E enter the OFF state.

At timing t112 in the read operation, discharge of the local block connection line LBI_a in the memory layer ML_E, ML_O ends. For example, as illustrated in FIG. 27, the voltage of the signal line Pre_reset is set to "L". Thus, the transistor Tr4 enters the OFF state.

Figure 28:
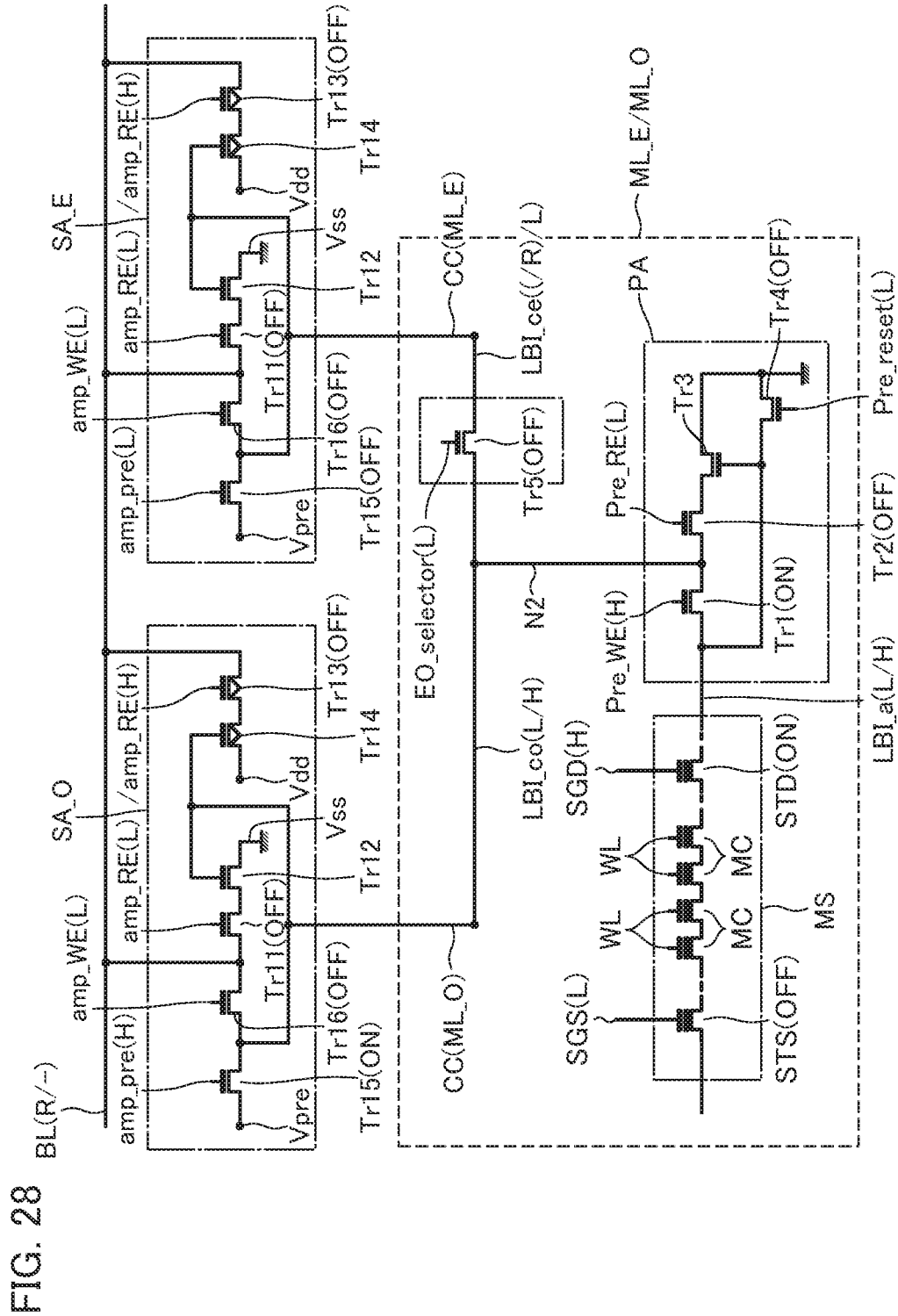
FIG. 28 is a schematic circuit diagram for describing the read operation.

At timing t113 in the read operation, a precharge operation is performed. For example, as illustrated in FIG. 28, the signal line Pre_WE and the signal line amp_pre corresponding to the sense amplifier circuit SA_O are set to "H". Thus, the transistor Tr1 and the transistor Tr15 corresponding to the sense amplifier circuit SA_O enter the ON state. In association with this, the voltages in the local block connection lines LBI_co, LBI_a and the memory string MS in the memory layer ML_O become "H".

Figure 29:
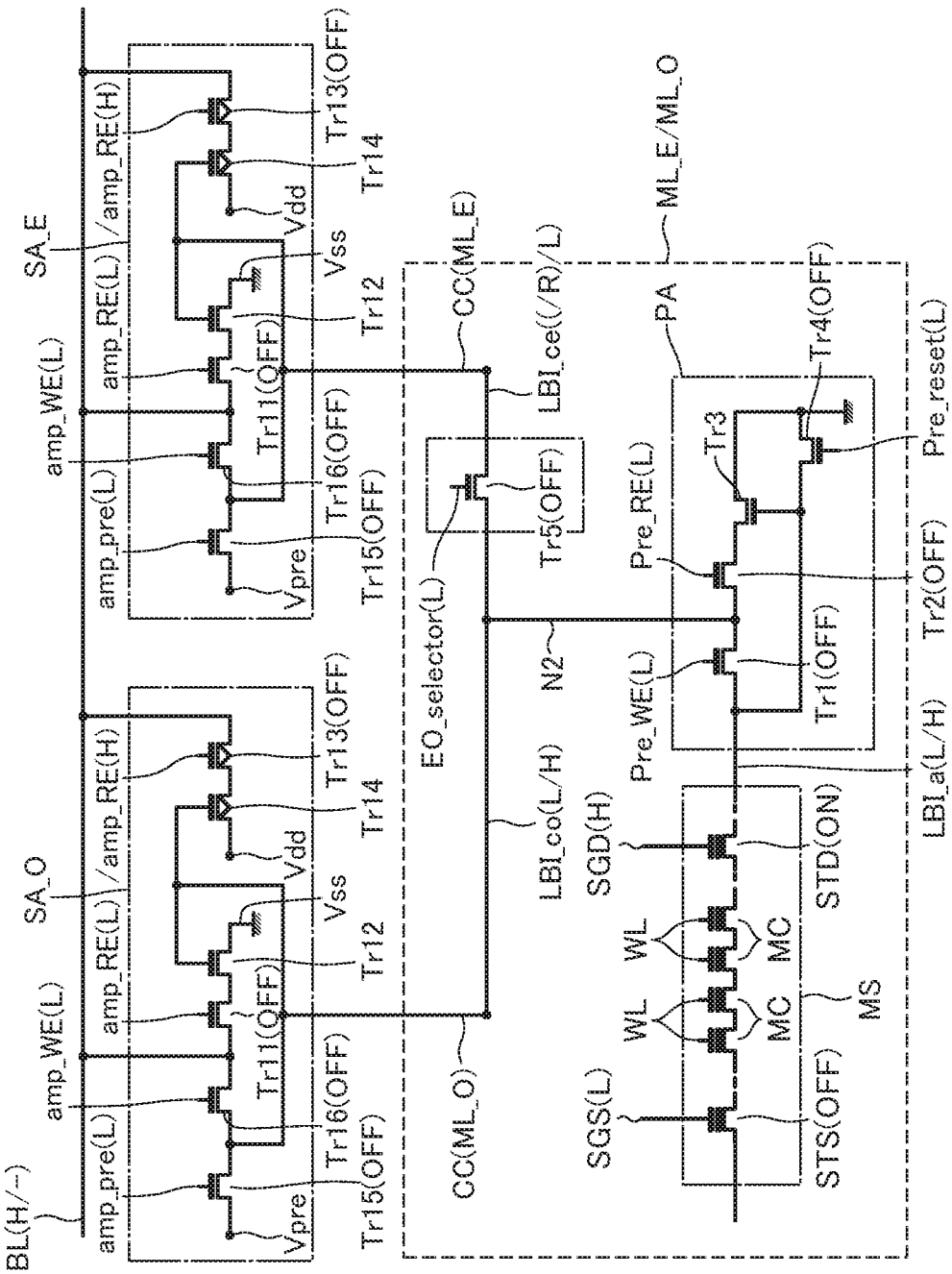
FIG. 29 is a schematic circuit diagram for describing the read operation.

At timing t114 in the read operation, the precharge operation ends. For example, as illustrated in FIG. 29, the signal line Pre_WE and the signal line amp_pre corresponding to the sense amplifier circuit SA_O are set to "L". Thus, the transistor Tr1 and the transistor Tr15 corresponding to the sense amplifier circuit SA_O enter the OFF state.

Additionally, at timing t114 in the read operation, for example, as illustrated in FIG. 29, the bit line BL corresponding to the memory layer ML_E is set to "H".

Figure 30:
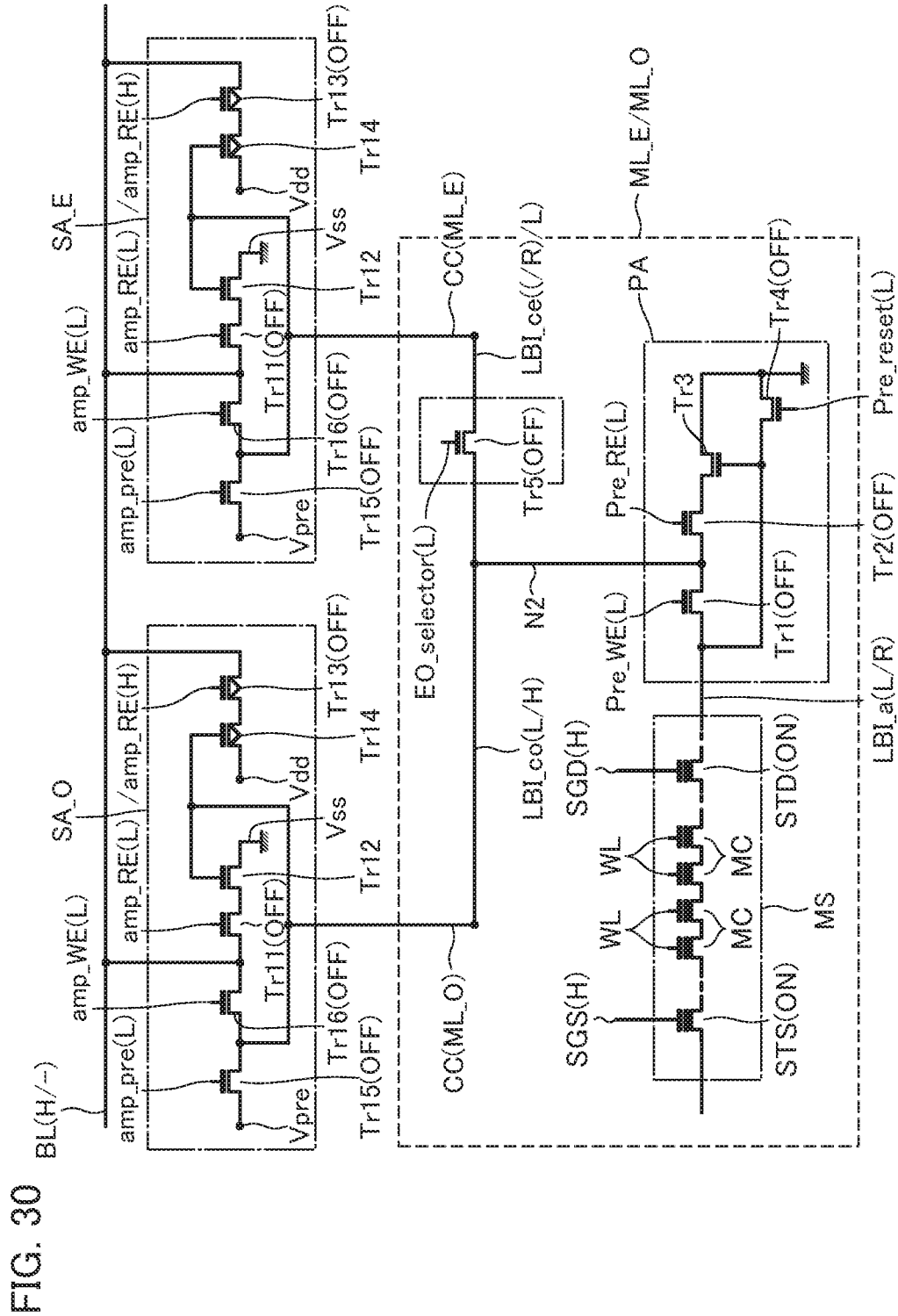
FIG. 30 is a schematic circuit diagram for describing the read operation.

At timing t115 in the read operation, a discharge operation is performed. For example, as illustrated in FIG. 30, the voltage of the source-side select gate line SGS is set to "H". Thus, the source-side select transistor STS enters the ON state.

Here, in the memory layer ML_O, the read data R is read.

On the other hand, in the memory layer ML_E, the voltages of the local block connection line LBI_a and the memory string MS are maintained to be "L".

Figure 31:
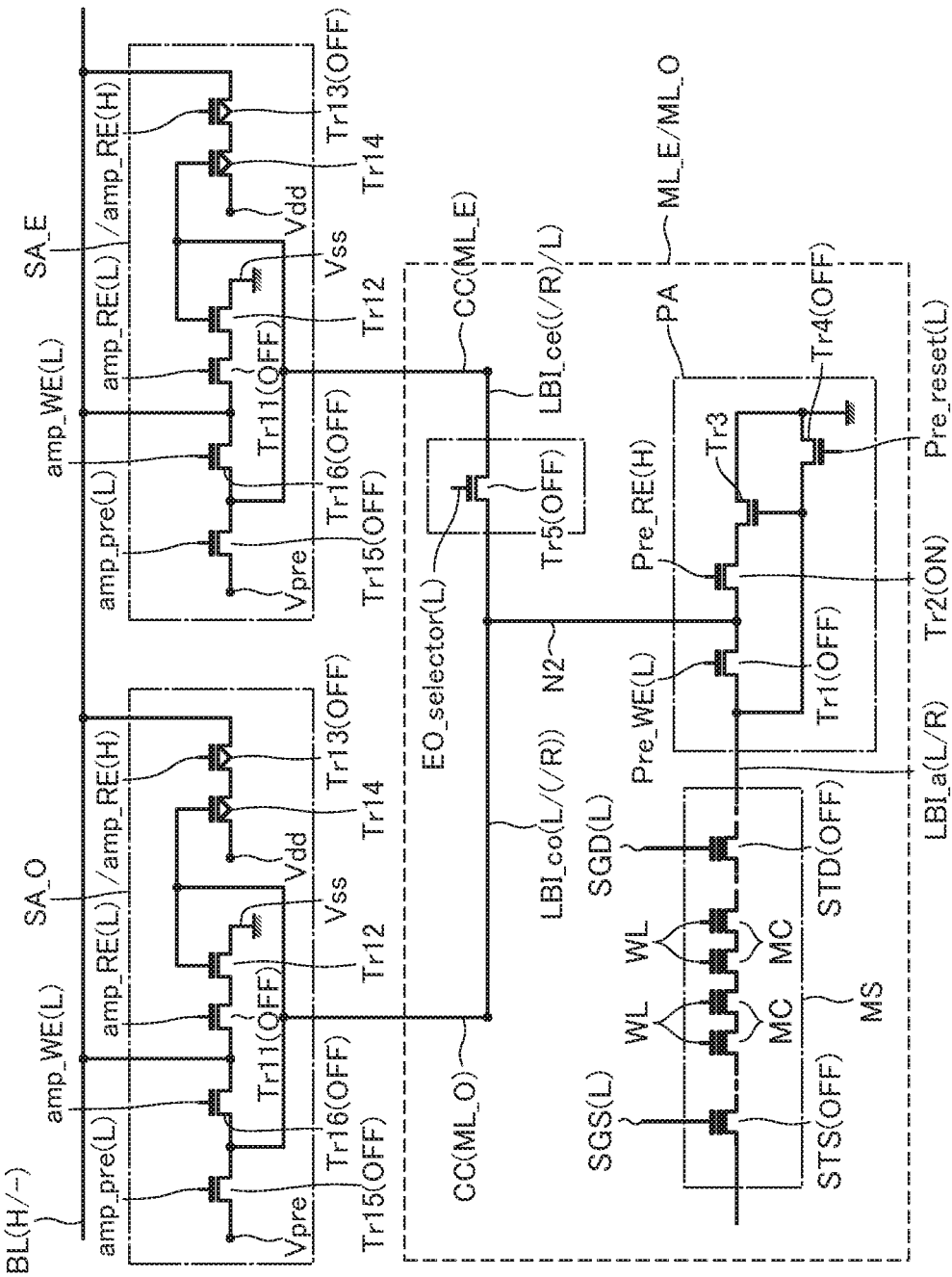
FIG. 31 is a schematic circuit diagram for describing the read operation.

At timing t116 in the read operation, the discharge operation ends. For example, as illustrated in FIG. 31, the voltages of the word lines WL, the drain-side select gate line SGD, and the source-side select gate line SGS are set to "L". Thus, the memory cell MC, the drain-side select gate line SGD, and the source-side select transistor STS enter the OFF state.

Additionally, at timing t116 in the read operation, a pre-amplifier operation is performed. For example, as illustrated in FIG. 31, the voltage of the signal line Pre_RE is set to "H". Thus, the transistor Tr2 enters the ON state.

Here, the read data corresponding to the memory layer ML_O is transferred to the sense amplifier circuit SA_O as the inverted data/R.

Note that, in the memory layer ML_E, the transistor Tr3 is in the OFF state. Additionally, the voltage of the node N2 is maintained to be "L".

Figure 32:
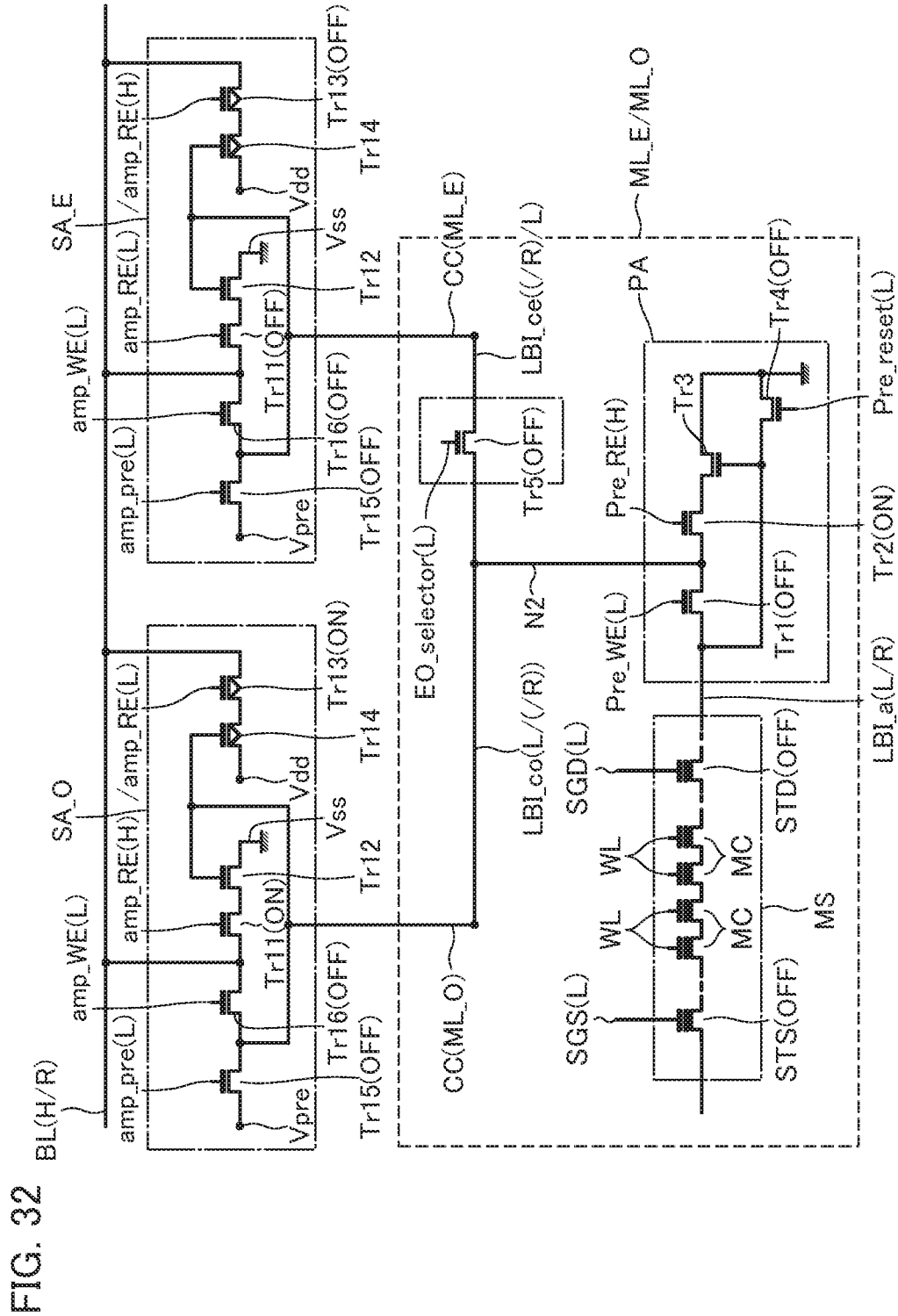
FIG. 32 is a schematic circuit diagram for describing the read operation.

At timing t117 in the read operation, an amplifier operation is performed. For example, as illustrated in FIG. 32, the signal lines amp_RE, /amp_RE corresponding to the sense amplifier circuit SA_O are set to "H, L". Thus, the transistors Tr11, Tr13 in the sense amplifier circuit SA_O enter the ON state.

Here, the inverted data/R corresponding to the memory layer ML_O is transferred to the bit line BL as the read data R. The read data R transferred to the bit line BL is further transferred to a circuit (not illustrated).

Figure 33:
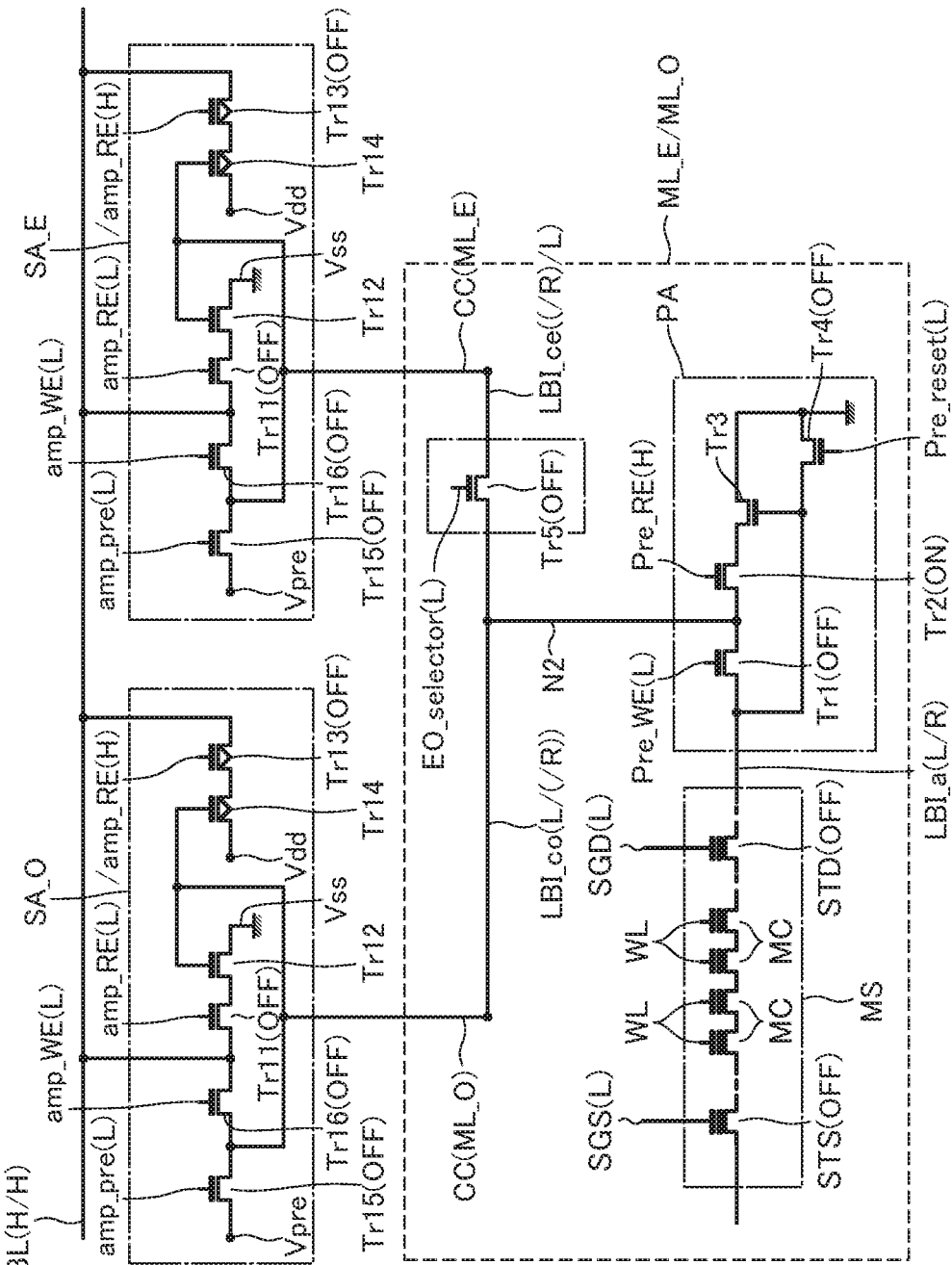
FIG. 33 is a schematic circuit diagram for describing the read operation.

At timing t118 in the read operation, the amplifier operation ends. For example, as illustrated in FIG. 33, the signal lines amp_RE, /amp_RE corresponding to the sense amplifier circuit SA_O are set to "L, H". Thus, the transistors Tr11, Tr13 in the sense amplifier circuit SA_E enter the OFF state.

Additionally, at timing t118 in the read operation, for example, as illustrated in FIG. 33, the bit line BL corresponding to the memory layer ML_O is set to "H".

Effects

As described with reference to FIG. 2, in the semiconductor memory device according to the embodiment, the plurality of local block regions $R_{LBLK}$ are arranged in the Y-direction. Moreover, the hook-up regions are not disposed corresponding to these respective plurality of local block regions $R_{LBLK}$, but the common hook-up region $R_{HU}$ corresponding to these plurality of local block regions $R_{LBLK}$ is disposed. With this configuration, the area of the hook-up region $R_{HU}$ can be substantially reduced.

Here, in the semiconductor memory device according to the embodiment, the local block connection line regions $R_{LBIG}$ are disposed as the regions to connect the plurality of local block regions $R_{LBLK}$ and the hook-up region $R_{HU}$. As illustrated in FIG. 3 and the like, in the local block connection line region $R_{LBIG}$, the conductive layer 180 is disposed in each of the memory layers ML. With this configuration, capacitance possibly increases between the plurality of conductive layers 180 arranged in the Z-direction.

Here, for example, as described with reference to FIG. 22 and FIG. 30, in the read operation, the discharge operation is performed. In the discharge operation, the electric charges in the local block connection lines LBI_a, LBI_b are discharged via the memory strings MS. Here, in a case where the operation is simultaneously performed on all of the memory layers ML, times required for the discharge operation significantly vary in some cases. In this case, the data stored in the selected memory cell MC fails to be preferably read in some cases.

For example, when the selected memory cells MC are in the ON state in the two memory layers ML arranged in the Z-direction, the times required for the discharge operation in these two memory layers ML are comparatively short. On the other hand, in a case where the selected memory cell MC is in the ON state only in one of the two memory layers ML arranged in the Z-direction, the times required for the discharge operation are comparatively long in these two memory layers ML.

Therefore, in the embodiment, the sense amplifier circuit SA_O and the sense amplifier circuit SA_E are controllable independently from one another.

In the embodiment, as described with reference to FIG. 22, to perform the discharge operation corresponding to the memory layer ML_E, the voltages of the local block connection lines LBI_a, LBI_b in the memory layer ML_O are set to the ground voltages. Additionally, to perform the discharge operation corresponding to the memory layer ML_O, the voltages of the local block connection lines LBI_a, LBI_b in the memory layer ML_E are set to the ground voltages.

With this method, the variation of the times required for the discharge operation in all of the memory layers ML can be substantially reduced. Thus, the data stored in the selected memory cell MC can be preferably read.

Additionally, to perform the operation, for example, it is considered to transfer the read data R corresponding to the memory layer ML_E to the bit line BL and further, after charging of the bit line BL ends, the voltage of the drain-side select gate line SGD is set to "H" to acquire the read data R corresponding to the memory layer ML_O. However, in this case, the time required for the read operation possibly increases to around double.

Therefore, in the embodiment, as described with reference to FIG. 11 and FIG. 12, the transistor Try is disposed between the node N2 and the local block connection line LBI_ce. In the embodiment, the transistor Tr4 is disposed between the node N3 and the local block connection line LBI_b.

With this configuration, for example, as described with reference to FIG. 24, while the read data R (inverted data/R) is latched in the local block connection line LBI_ce in the memory layer ML_E, the local block connection lines LBI_ce and the nodes N2 can be electrically separated in all of the memory layers ML.

For example, as described with reference to FIG. 25, while the read data R (inverted data/R) is latched in the local block connection line LBI_ce in the memory layer ML_E, the ground voltage can be applied to the local block connection lines LBI_ce and the nodes N2 in all of the memory layers ML.

Additionally, for example, as described with reference to FIG. 26, the transfer of the read data R corresponding to the memory layer ML_E to the bit line BL and the discharge operation corresponding to the memory layer ML_O can be performed in parallel. Accordingly, the time required for the read operation can be shortened.

In the embodiment, the transistors Tr4, Tr5 are disposed, not in the transistor layer $L_T$ (FIG. 1), but in each of the memory layers ML. With this configuration, the substantial reduction in circuit area is possible in some cases.

Second Embodiment

Next, a semiconductor memory device according to the second embodiment will be described. In the following description, parts similar to those of the semiconductor memory device according to the first embodiment are attached by the same reference numerals, thereby omitting the description.

Figure 34:
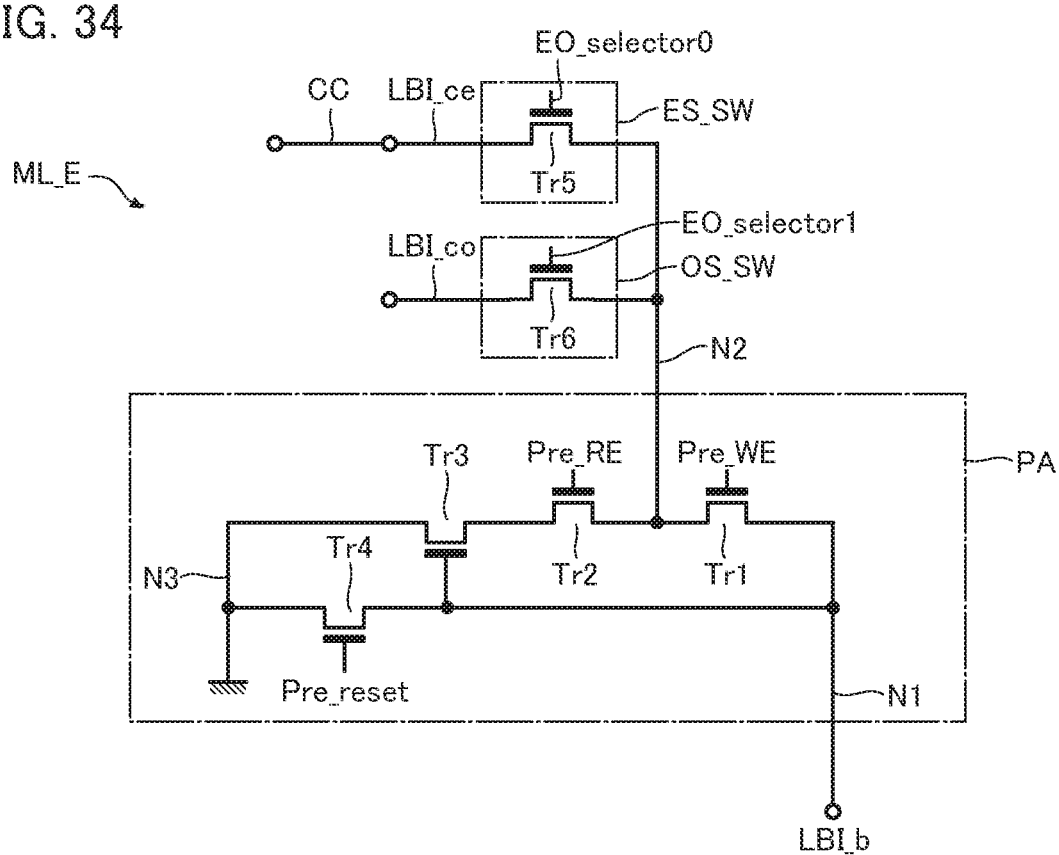
FIG. 34 is a schematic circuit diagram for describing a configuration of a part of a semiconductor memory device according to a second embodiment.
Figure 35:
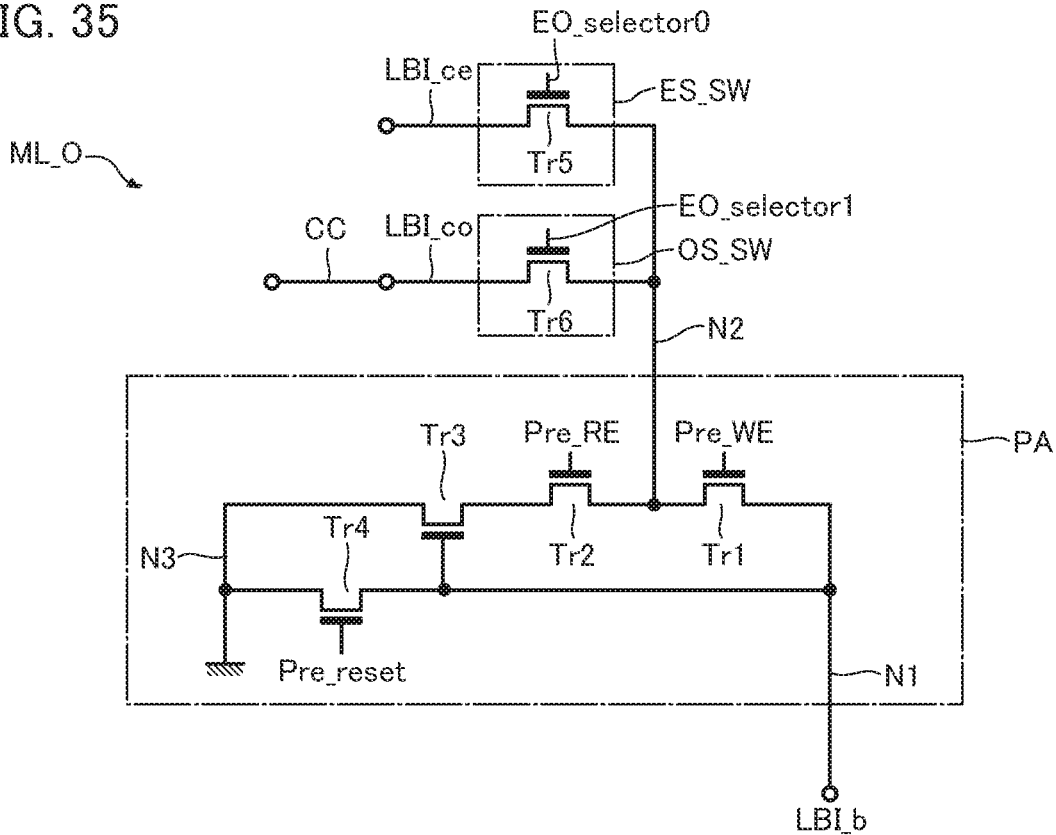
FIG. 35 is a schematic circuit diagram for describing a configuration of a part of the semiconductor memory device according to the second embodiment.
Figure 36:
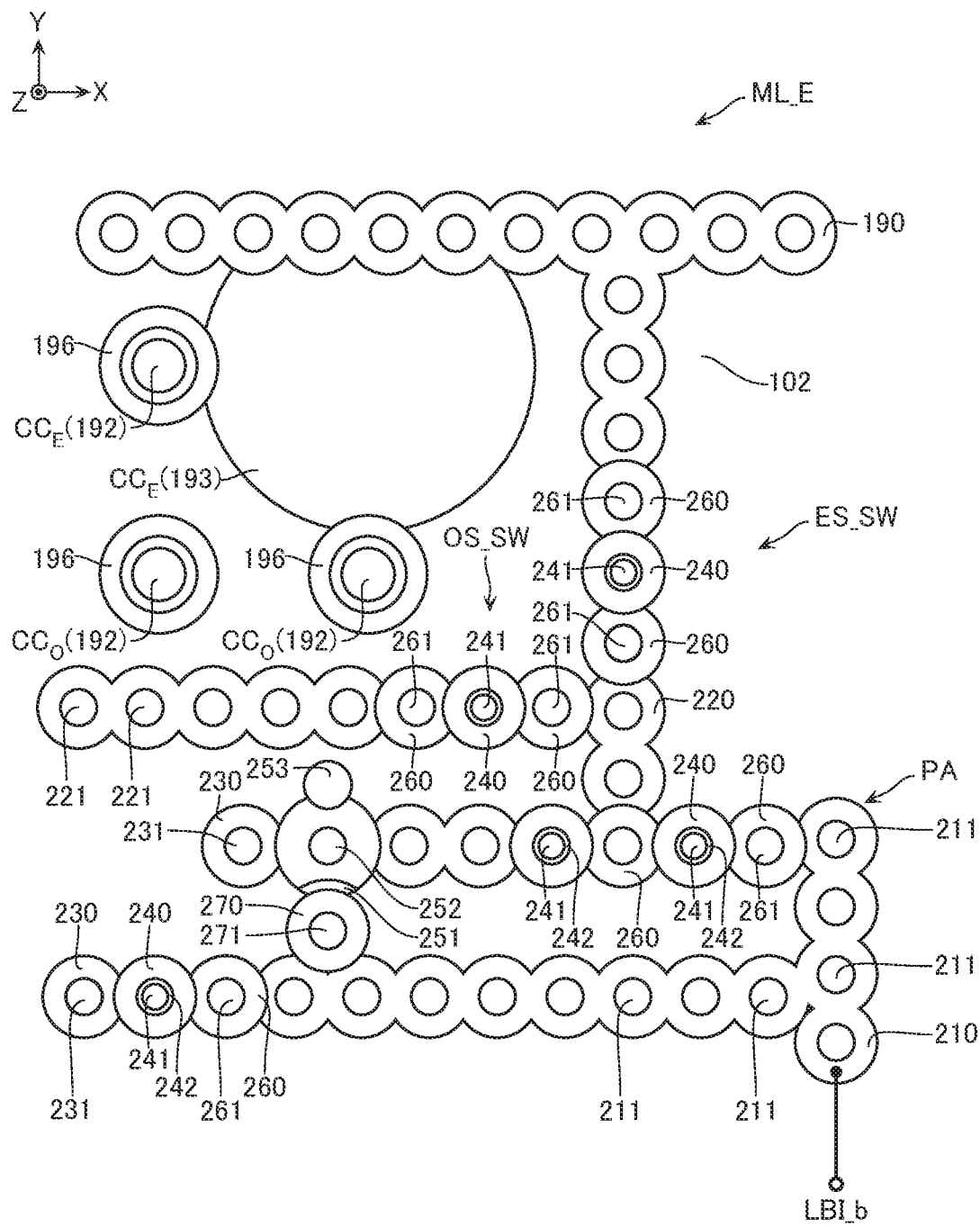
FIG. 36 is a schematic plan view for describing a configuration of a part of the semiconductor memory device according to the second embodiment.

FIG. 34 and FIG. 35 are schematic circuit diagrams for describing a configuration of a part of the semiconductor memory device according to the embodiment. FIG. 36 is a schematic plan view for describing the configuration of a part of the semiconductor memory device according to the embodiment.

The semiconductor memory device according to the second embodiment is configured basically similarly to the semiconductor memory device according to the first embodiment.

However, as described with reference to FIG. 11 and FIG. 12, in the first embodiment, in each of the memory layers ML, the node N2 electrically conducts with the local block connection line LBI_co directly without via the transistor or the like. Meanwhile, as illustrated in FIG. 34 and FIG. 35, in the second embodiment, in each of the memory layers ML, a switch circuit OS_SW is disposed in a current path between the node N2 and the local block connection line LBI_co.

The switch circuit OS_SW includes a transistor Tr6. A source electrode of the transistor Tr6 is connected to the local block connection line LBI_co. A drain electrode of the transistor Tr6 is connected to the node N2. A gate electrode of the transistor Tr6 is connected to a signal line EO_selector1.

Note that, in FIG. 34 and FIG. 35, the signal line EO_selector corresponding to the switch circuit ES_SW is indicated as a signal line EO_selector0.

As illustrated in FIG. 36, the switch circuit OS_SW may be configured similarly to the switch circuit ES_SW. That is, each of the memory layers ML may include the semiconductor layers 240 that function as channel regions of the transistors Tr6 and the semiconductor layers 260 that function as source regions and drain regions of the transistors Tr6. In the hook-up region, the via-electrodes 241 that function as the gate electrodes of the transistors Tr6 and the insulating layers 242 that function as gate insulating films of the transistors Tr6 may be disposed.

With this configuration, the capacitance in each of the wirings in the memory layer ML_E and the capacitance in each of the wirings in the memory layer ML_O can be matched. Thus, there may be a case where the read operation can be more preferably performed.

Other Embodiments

The semiconductor memory devices according to the first embodiment and the second embodiment have been described above. However, the configurations, the operations, and the like described above are merely examples, and the specific configurations, operations, and the like are appropriately adjustable.

For example, in the semiconductor memory device according to the second embodiment, the switch circuit ES_SW may be omitted.

Additionally, the read operation as described as an example in FIG. 17 is merely an example, and the specific method is appropriately adjustable.

For example, in the semiconductor memory device according to the first embodiment, as described with reference to FIG. 17 and the like, the amplifier operation corresponding to the memory layer ML_E and control of the drain-side select gate line SGD to acquire the read data R corresponding to the memory layer ML_O are performed at the same timing till. However, the operations from timings till to t118 corresponding to the memory layer ML_O are possibly started at any of the timings of the timing at and after the voltage of the signal line EO_selector being set to "L" and a timing before the bit line BL corresponding to the memory layer ML_E being charged. Thus, the time required for the read operation can be shortened.

For example, the configuration of the pre-amplifier circuit PA described as an example above is merely an example, and the specific configuration is appropriately adjustable.

Figure 37:
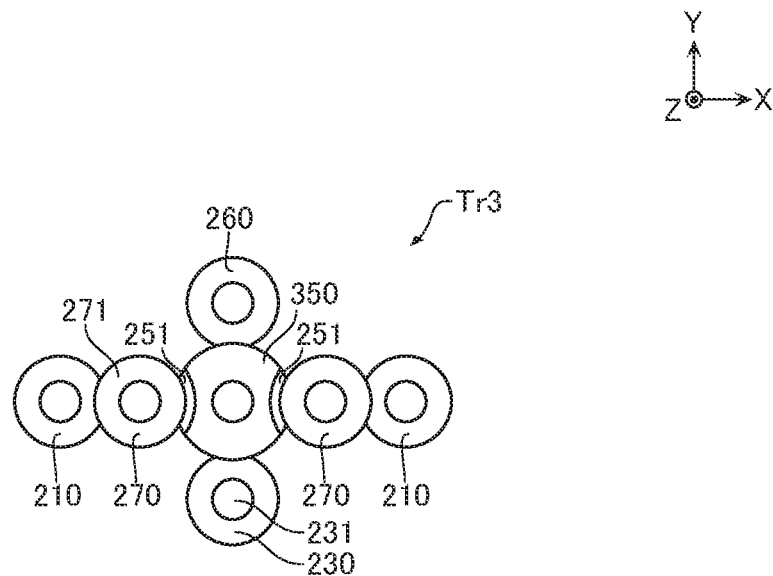
FIG. 37 is a schematic plan view for describing a configuration of a part of a semiconductor memory device according to another embodiment.

For example, in the example of FIG. 13 and FIG. 14, the transistor Tr3 includes the semiconductor layer 250 and the semiconductor layer 253 in contact with a part of the outer peripheral surface of the semiconductor layer 250. Meanwhile, in the example of FIG. 37, the transistor Tr3 includes a semiconductor layer 350 instead of the semiconductor layer 250. Additionally, this configuration does not include the semiconductor layer 253.

The semiconductor layer 350 is configured basically similarly to the semiconductor layer 250. However, one insulating layer 251 is disposed on the outer peripheral surface of the semiconductor layer 250, and the semiconductor layer 250 is opposed to one semiconductor layer 270 via the insulating layer 251. On the other hand, the two insulating layers 251 are disposed on the outer peripheral surface of the semiconductor layer 350, and the semiconductor layer 350 is opposed to the two semiconductor layers 270 via these insulating layers 251. In the configuration, a channel width of the transistor Tr3 configured by the semiconductor layer 350 can be increased to increase an ON current.

Figure 38:
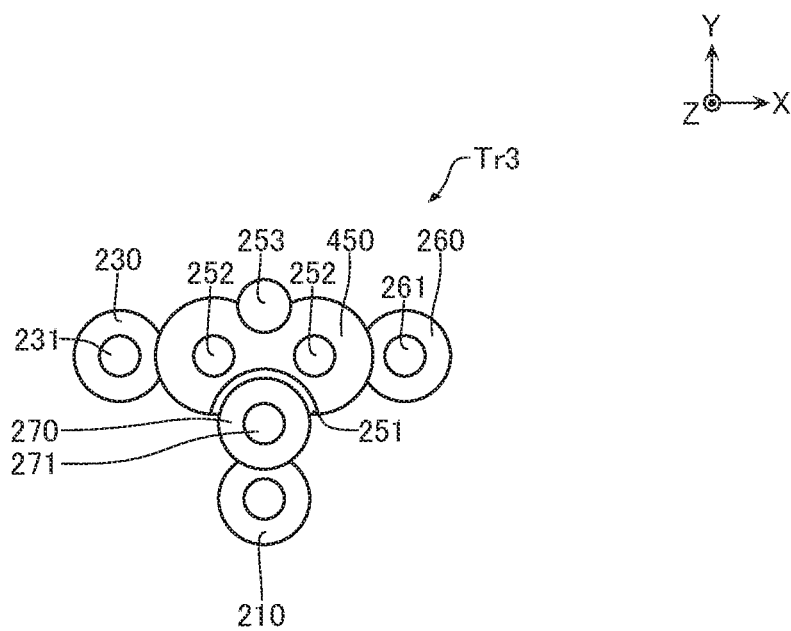
FIG. 38 is a schematic plan view for describing a configuration of a part of a semiconductor memory device according to another embodiment.

For example, in the example of FIG. 13 and FIG. 14, the transistor Tr3 includes the semiconductor layer 250 and one insulating layer 252 in contact with this semiconductor layer 250. Meanwhile, in the example of FIG. 38, the transistor Tr3 includes a semiconductor layer 450 instead of the semiconductor layer 250 and the two insulating layers 252 in contact with the semiconductor layer 450.

The semiconductor layer 450 is configured basically similarly to the semiconductor layer 250. However, a part of the outer peripheral surface of the semiconductor layer 250 is disposed along the circumference of one circle with the center position of one insulating layer 252 as its center. Additionally, the other part of the outer peripheral surface of the semiconductor layer 250 is disposed within the range of the circle. On the other hand, a part of an outer peripheral surface of the semiconductor layer 450 is disposed along circumferences of two circles with center positions of the two insulating layers 252 as their respective centers. The other part of the outer peripheral surface of the semiconductor layer 450 is disposed within a range of at least one of the two circles. An opposed area of the semiconductor layer 450 with the semiconductor layer 270 is larger than an opposed area of the semiconductor layer 250 with the semiconductor layer 270. This configuration allows increasing a channel length of the transistor Tr3 configured by the semiconductor layer 450 and reducing an off-leakage current.

Figure 39:
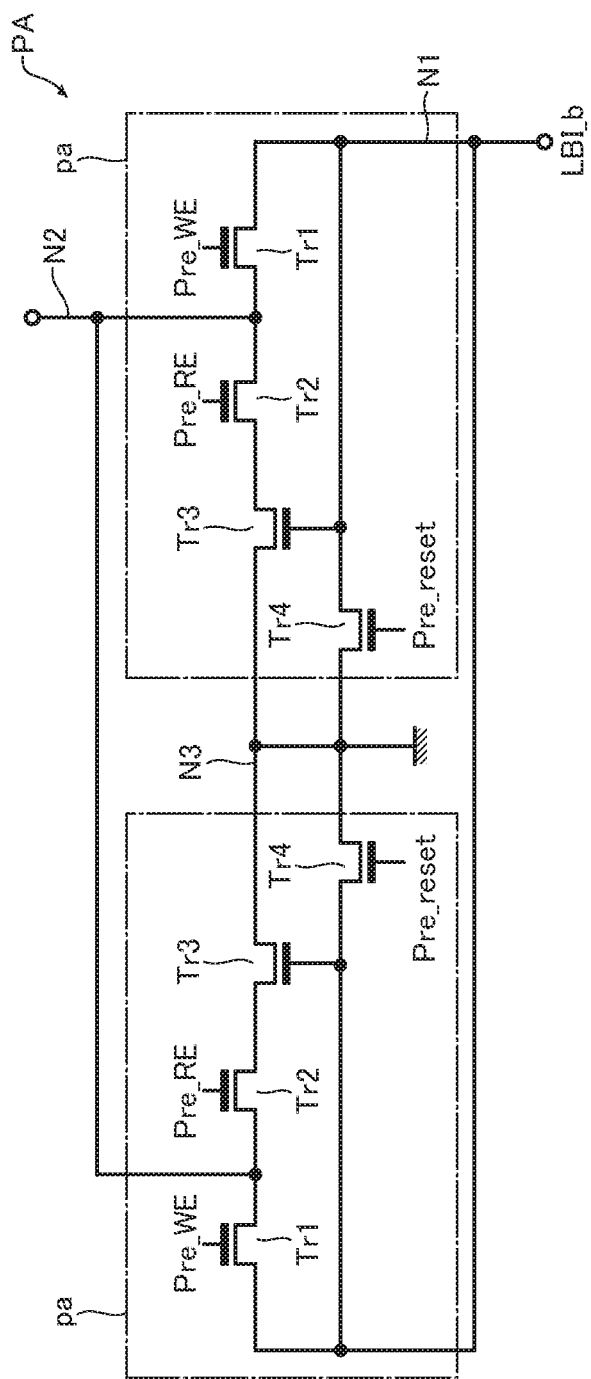
FIG. 39 is a schematic circuit diagram for describing a configuration of a part of a semiconductor memory device according to another embodiment.

Additionally, for example, as illustrated in FIG. 39, the pre-amplifier circuit PA may include two or more circuit elements pa connected in parallel between the nodes N1, N2. Each of the circuit elements pa may include the transistors Tr1, Tr2, Tr3, Tr4 described with reference to FIG. 11 and FIG. 12.

The semiconductor memory devices according to the first embodiment and the second embodiment include so-called NAND flash memories. However, the configurations described as examples in the first embodiment and the second embodiment are applicable to a semiconductor memory device not including the NAND flash memory. For example, the configurations as described in the first embodiment and the second embodiment as examples are applicable to a configuration that includes semiconductor layers extending in the Y-direction in the plurality of memory layer ML and one or a plurality of memory transistors treating the semiconductor layers as channel regions. The configurations as described in the first embodiment and the second embodiment as examples are applicable to a configuration including another memory transistor. Additionally, the configurations as described in the first embodiment and the second embodiment as examples are applicable to another memory.

Additionally, as described with reference to FIG. 7 to FIG. 9, the via-contact electrode CC according to the first embodiment and the second embodiment includes the part 192 extending in the Z-direction and the approximately disk-shaped part 193 connected to the lower end of the part 192. However, the configuration of the via-contact electrode CC is appropriately adjustable. For example, in the first embodiment and the second embodiment, the approximately disk-shaped parts 193 may be omitted from the via-contact electrodes CC. In the case, for example, the respective lower ends of the plurality of via-contact electrodes CC may be connected to the upper surfaces of the plurality of conductive layers 190 stacked in the Z-direction.

Others

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a substrate; and
   a plurality of first memory layers and a plurality of second memory layers arranged in alternation in a first direction intersecting with a surface of the substrate, wherein
   the substrate includes:
      a plurality of local block regions arranged in a second direction intersecting with the first direction; and
      a hook-up region arranged in the second direction with respect to the plurality of local block regions,
   in the plurality of local block regions, each of the plurality of first memory layers and the plurality of second memory layers includes:
      a plurality of memory strings extending in the second direction and arranged in a third direction intersecting with the first direction and the second direction; and
      a first wiring extending in the third direction and connected to the plurality of memory strings in common,
   in the hook-up region, each of the plurality of first memory layers and the plurality of second memory layers includes:
      a signal amplifier circuit electrically connected to the first wiring;
      a second wiring connected to the signal amplifier circuit;
      a first switch transistor connected to the second wiring;
      a third wiring electrically connected to the second wiring via the first switch transistor; and
      a fourth wiring electrically connected to the second wiring without via the first switch transistor, wherein
   the hook-up region includes:
      a plurality of first via-contact electrodes extending in the first direction and connected to the third wirings in the plurality of first memory layers; and
      a plurality of second via-contact electrodes extending in the first direction and connected to the fourth wirings in the plurality of second memory layers.

2. The semiconductor memory device according to claim 1, wherein
   each of a plurality of the first switch transistors corresponding to the plurality of first memory layers and a plurality of the first switch transistors corresponding to the plurality of second memory layers includes a first semiconductor layer,
   the hook-up region includes a first via-electrode extending in the first direction, and
   the first via-electrode is opposed to a plurality of the first semiconductor layers included in the plurality of first memory layers and a plurality of the first semiconductor layers included in the plurality of second memory layers.

3. The semiconductor memory device according to claim 1, wherein
   in the hook-up region:
      each of the plurality of first memory layers and the plurality of second memory layers includes a second switch transistor connected to the second wiring;
      a plurality of the third wirings are electrically connected to the second wirings without via the second switch transistors; and
      a plurality of the fourth wirings are electrically connected to the second wirings via the second switch transistors.

4. The semiconductor memory device according to claim 3, wherein each of a plurality of the second switch transistors corresponding to the plurality of first memory layers and a plurality of the second switch transistors corresponding to the plurality of second memory layers includes a second semiconductor layer, the hook-up region includes a second via-electrode extending in the first direction, and the second via-electrode is opposed to a plurality of the second semiconductor layers included in the plurality of first memory layers and a plurality of the second semiconductor layers included in the plurality of second memory layers.

5. The semiconductor memory device according to claim 1, comprising a first voltage supply line that applies a first voltage, wherein each of a plurality of the signal amplifier circuits corresponding to the plurality of first memory layers and a plurality of the signal amplifier circuits corresponding to the plurality of second memory layers includes:
 a fifth wiring electrically connected to the first wiring;
 a first transistor electrically connected between the fifth wiring and the second wiring;
 a second transistor electrically connected between the second wiring and the first voltage supply line;
 a third transistor electrically connected between the second transistor and the first voltage supply line; and
 a fourth transistor electrically connected between the fifth wiring and the first voltage supply line, wherein
the fifth wiring is connected to a gate electrode of the third transistor.

6. The semiconductor memory device according to claim 5, wherein each of the plurality of local block regions includes a sixth wiring, each of the plurality of memory strings includes:
 a plurality of memory cells connected in series;
 a first select transistor electrically connected between the plurality of memory cells and the first wiring; and
 a second select transistor electrically connected between the plurality of memory cells and the sixth wiring.

7. The semiconductor memory device according to claim 6, comprising:

a second voltage supply line that applies a second voltage larger than the first voltage;

a fifth transistor electrically connected between the second voltage supply line and one of the plurality of first via-contact electrodes; and a sixth transistor electrically connected between the second voltage supply line and one of the plurality of second via-contact electrodes.

8. The semiconductor memory device according to claim 7, wherein in a read operation,
 a voltage that turns ON the fourth transistor is applied to a gate electrode of the fourth transistor at a first timing;
 a voltage that turns ON the fifth transistor is applied to a gate electrode of the fifth transistor at a second timing after the first timing;
 a voltage that turns ON the second select transistor is applied to a gate electrode of the second select transistor at a third timing after the second timing;
 a voltage that turns ON the fourth transistor is applied to the gate electrode of the fourth transistor at a fourth timing after the third timing;
 a voltage that turns ON the sixth transistor is applied to a gate electrode of the sixth transistor at a fifth timing after the fourth timing; and
 a voltage that turns ON the second select transistor is applied to the gate electrode of the second select transistor at a sixth timing after the fifth timing.

9. The semiconductor memory device according to claim 8, wherein a voltage that turns ON the first switch transistor is applied to a gate electrode of the first switch transistor from the first timing to the third timing, and at the fourth timing, the first switch transistor is in a state in which a voltage that turns OFF the first switch transistor is applied to the gate electrode of the first switch transistor.

10. The semiconductor memory device according to claim 8, wherein data corresponding to at least one of the plurality of first memory layers is transferred to a first bit line at a seventh timing after the third timing, a third voltage is applied to the first bit line at an eighth timing after the seventh timing, a voltage that turns OFF the first switch transistor is applied to a gate electrode of the first switch transistor at a ninth timing after the third timing and before the fourth timing, and a voltage that turns ON the first select transistor is applied to a gate electrode of the first select transistor at a tenth timing at and after the ninth timing and before the eighth timing.

11. The semiconductor memory device according to claim 1, wherein each of the plurality of memory strings includes:
 a third semiconductor layer extending in the second direction;
 a third via-electrode opposed to the third semiconductor layer in the third direction and extending in the first direction; and
 an electric charge accumulating layer disposed between the third semiconductor layer and the third via-electrode.

12. The semiconductor memory device according to claim 1, further comprising:

a transistor layer arranged in the first direction with respect to the substrate, the plurality of first memory layers, and the plurality of second memory layers, wherein the transistor layer includes at least two second signal amplifier circuits, one of the at least two second signal amplifier circuits is electrically connected to the second wiring via at least one of the plurality of first via-contact electrodes, and another one of the at least two second signal amplifier circuits is electrically connected to the second wiring via at least one of the plurality of second via-contact electrodes.

13. A semiconductor memory device comprising:

a substrate; and a plurality of first memory layers and a plurality of second memory layers arranged in alternation in a first direction intersecting with a surface of the substrate, wherein the substrate includes:

a plurality of local block regions arranged in a second direction intersecting with the first direction; and a hook-up region arranged in the second direction with respect to the plurality of local block regions, in the plurality of local block regions, each of the plurality of first memory layers and the plurality of second memory layers includes:

a plurality of memory strings extending in the second direction and arranged in a third direction intersecting with the first direction and the second direction; and a first wiring extending in the third direction and connected to the plurality of memory strings in common, in the hook-up region, each of the plurality of first memory layers and the plurality of second memory layers includes:

a signal amplifier circuit electrically connected to the first wiring; and a second wiring connected to the signal amplifier circuit, wherein in the plurality of local block regions, each of the plurality of first memory layers includes a first switch transistor connected to the second wiring, in the plurality of local block regions, each of the plurality of second memory layers includes a second switch transistor connected to the second wiring, and the hook-up region includes:

a first via-contact electrode extending in the first direction and connected to the second wiring included in one of the plurality of first memory layers via the first switch transistor; and a second via-contact electrode extending in the first direction and connected to the second wiring included in one of the plurality of second memory layers via the second switch transistor.

14. The semiconductor memory device according to claim 13, wherein each of a plurality of the first switch transistors corresponding to the plurality of first memory layers and a plurality of the first switch transistors corresponding to the plurality of second memory layers includes a first semiconductor layer, the hook-up region includes a first via-electrode extending in the first direction, and the first via-electrode is opposed to a plurality of the first semiconductor layers included in the plurality of first memory layers and a plurality of the first semiconductor layers included in the plurality of second memory layers.

15. The semiconductor memory device according to claim 13, wherein each of a plurality of the second switch transistors corresponding to the plurality of first memory layers and a plurality of the second switch transistors corresponding to the plurality of second memory layers includes a second semiconductor layer, the hook-up region includes a second via-electrode extending in the first direction, and the second via-electrode is opposed to a plurality of the second semiconductor layers included in the plurality of first memory layers and a plurality of the second semiconductor layers included in the plurality of second memory layers.

16. The semiconductor memory device according to claim 13, comprising a first voltage supply line that applies a first voltage, wherein each of a plurality of the signal amplifier circuits corresponding to the plurality of first memory layers and a plurality of the signal amplifier circuits corresponding to the plurality of second memory layers includes:

a fifth wiring electrically connected to the first wiring;

a first transistor electrically connected between the fifth wiring and the second wiring;

a second transistor electrically connected between the second wiring and the first voltage supply line;

a third transistor electrically connected between the second transistor and the first voltage supply line; and a fourth transistor electrically connected between the fifth wiring and the first voltage supply line, wherein the fifth wiring is connected to a gate electrode of the third transistor.

17. The semiconductor memory device according to claim 16, wherein each of the plurality of local block regions includes a sixth wiring, each of the plurality of memory strings includes:

a plurality of memory cells connected in series;

a first select transistor electrically connected between the plurality of memory cells and the first wiring; and a second select transistor electrically connected between the plurality of memory cells and the sixth wiring the semiconductor memory device includes:

a second voltage supply line that applies a second voltage larger than the first voltage;

a fifth transistor electrically connected between the second voltage supply line and the first via-contact electrode; and a sixth transistor electrically connected between the second voltage supply line and the second via-contact electrode, wherein in a read operation, a voltage that turns ON the fourth transistor is applied to a gate electrode of the fourth transistor at a first timing;

a voltage that turns ON the fifth transistor is applied to a gate electrode of the fifth transistor at a second timing after the first timing;

a voltage that turns ON the second select transistor is applied to a gate electrode of the second select transistor at a third timing after the second timing;

a voltage that turns ON the fourth transistor is applied to the gate electrode of the fourth transistor at a fourth timing after the third timing;

a voltage that turns ON the sixth transistor is applied to a gate electrode of the sixth transistor at a fifth timing after the fourth timing; and a voltage that turns ON the second select transistor is applied to the gate electrode of the second select transistor at a sixth timing after the fifth timing.

18. The semiconductor memory device according to claim 17, wherein a voltage that turns ON the first switch transistor is applied to a gate electrode of the first switch transistor from the first timing to the third timing, and at the fourth timing, the first switch transistor is in a state in which a voltage that turns OFF the first switch transistor is applied to the gate electrode of the first switch transistor.

19. The semiconductor memory device according to claim 18, wherein
- data corresponding to at least one of the plurality of first memory layers is transferred to a first bit line at a seventh timing after the third timing,
- a third voltage is applied to the first bit line at an eighth timing after the seventh timing,
- a voltage that turns OFF the first switch transistor is applied to the gate electrode of the first switch transistor at a ninth timing after the third timing and before the fourth timing, and
- a voltage that turns ON the first select transistor is applied to a gate electrode of the first select transistor at a tenth timing at and after the ninth timing and before the eighth timing.

20. The semiconductor memory device according to claim 13, further comprising:
- a transistor layer aligned in the first direction with respect to the substrate, the plurality of first memory layers, and the plurality of second memory layers, wherein
- the transistor layer includes at least two second signal amplifier circuits,
- one of the at least two second signal amplifier circuits is electrically connected to the second wiring via the first via-contact electrode, and
- another one of the at least two second signal amplifier circuits is electrically connected to the second wiring via the second via-contact electrode.

* * * * *